(12) United States Patent
Sakaguchi et al.

(10) Patent No.: US 8,759,685 B2
(45) Date of Patent: Jun. 24, 2014

(54) WIRING SUBSTRATE AND METHOD OF MANUFACTURING THE WIRING SUBSTRATE

(75) Inventors: Hideaki Sakaguchi, Nagano (JP); Akinori Shiraishi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 629 days.

(21) Appl. No.: 12/609,054

(22) Filed: Oct. 30, 2009

(65) Prior Publication Data

US 2010/0108361 A1    May 6, 2010

(30) Foreign Application Priority Data

Nov. 5, 2008   (JP) ................................ 2008-284147

(51) Int. Cl.
    *H05K 1/00*    (2006.01)
    *H05K 1/03*    (2006.01)
(52) U.S. Cl.
    USPC ............ 174/250; 174/255; 174/258; 361/749
(58) Field of Classification Search
    CPC ... H05K 1/0281; H05K 1/0353; H05K 1/038; H05K 1/0386; H05K 2201/0293; H05K 2201/2009
    USPC ................ 174/251, 255, 261, 250, 252, 254; 361/793, 795, 749, 762, 771, 809, 829
    See application file for complete search history.

(56) References Cited

U.S. PATENT DOCUMENTS

| 3,638,573 | A * | 2/1972 | Campbell | 174/255 |
| 5,184,209 | A * | 2/1993 | Kodai et al. | 257/679 |
| 2004/0150118 | A1 * | 8/2004 | Honda | 257/778 |
| 2005/0012217 | A1 * | 1/2005 | Mori et al. | 257/758 |
| 2006/0096781 | A1 | 5/2006 | Yamano | |
| 2007/0009718 | A1 * | 1/2007 | Kanda | 428/209 |
| 2009/0126982 | A1 * | 5/2009 | Nakamura et al. | 174/262 |

FOREIGN PATENT DOCUMENTS

| JP | 2000-133948 | | 5/2000 |
| JP | 2006-135174 | A | 5/2006 |
| JP | 2007-019198 | | 1/2007 |

OTHER PUBLICATIONS

Machine English Translation of Takashi (JP 2007-019198A) provided.*
Office Action dated Jul. 10, 2012 issued with respect to the corresponding Japanese Patent Application No. 2008-284147.

* cited by examiner

*Primary Examiner* — Chau N Nguyen
*Assistant Examiner* — Roshn Varghese
(74) *Attorney, Agent, or Firm* — IPUSA, PLLC

(57) ABSTRACT

A wiring substrate includes a substrate body including first and second surfaces on opposite sides and a substrate side surface; a penetration electrode penetrating through the substrate body; a first wiring pattern on the first surface and including a first pad; a second wiring pattern on the second surface and including a second pad; a first insulating resin layer covering the first wiring pattern except for an area corresponding to the first pad and having a first resin side surface; a second insulating resin layer covering the second wiring pattern except for an area corresponding to the second pad and having a second resin side surface that is flush with the first resin side surface; a notch part encompassing at least apart of the substrate body and having a resin material provided therein. The substrate side surface is located more inward than the first and second resin side surfaces.

14 Claims, 42 Drawing Sheets

FIG.1 REALTED ART

WIRING SUBSTRATE AND METHOD OF MANUFACTURING THE WIRING SUBSTRATE

BACKGROUND OF THE INVENTION

1. Field of the Invention

The present invention generally relates to a wiring substrate and a method of manufacturing the wiring substrate. For example, there is a wiring substrate including a substrate body formed having a penetration electrode and a pad to which the penetration electrode and an electronic component are electrically connected, and a method for manufacturing the wiring substrate.

2. Description of the Related Art

FIG. 1 is a cross-sectional diagram illustrating a semiconductor device 200 according to a related art example. In FIG. 1, the semiconductor device 200 includes a wiring substrate 201, electronic components 202, 203, and external connection terminals 205, 206.

The wiring substrate 201 includes a substrate body 211, an insulating film 212, penetration electrodes 213, 214, wiring patterns 216-218, 221, 222, and solder resist layers 225, 226.

Further, through holes 231, 232 are formed in the substrate body 211. The substrate body 211 may be, for example, a silicon substrate, a compound (e.g., GaAs) semiconductor substrate, or a glass substrate (including a quartz glass substrate).

The insulating film 212 is formed in a manner covering an upper surface 211A and a lower surface 211E of the substrate body 211, and the surfaces of the substrate body 211 face the side surfaces of the through holes 231, 232.

The penetration electrode 213 is provided in the through hole 231 which has the insulating film 212 formed therein. The penetration electrode 214 is provided in the through hole 232 which has the insulating film 212 formed therein.

The wiring pattern 216 is provided on the insulating film 212 formed on the upper surface 211A of the substrate body 211. The wiring pattern 216 is connected to an upper end of the penetration electrode 213. The wiring pattern 216 includes a pad 216A on which the electronic component 203 is mounted.

The wiring pattern 217 is provided on the insulating film 212 formed on the upper surface 211A of the substrate body 211. The wiring substrate 217 is connected to an upper end of the penetration electrode 214. The wiring pattern 217 includes a pad 217A on which the electronic component 202 is mounted.

The wiring pattern 218 is provided on the insulating film 212 located between the electronic components 202 and 203. One end part of the wiring pattern 218 is connected to the pad 216A. The other end part of the wiring part 218 is connected to the pad 217A.

The wiring pattern 221 is provided on a lower surface of the insulating film 212 formed on the lower surface 211B of the substrate body 211. The wiring pattern 221 is connected to a lower end of the penetration electrode 213. Thereby, the wiring pattern 221 is electrically connected to the wiring pattern 216 via the penetration electrode 213. The wiring pattern 221 includes an external connection pad 221A.

The wiring pattern 222 is provided on a lower surface of the insulating film 212 formed on the lower surface 211B of the substrate body 211. The wiring pattern 222 is connected to a lower end of the penetration electrode 214. Thereby, the wiring pattern 222 is electrically connected to the wiring pattern 217 via the penetration electrode 214. The wiring pattern 222 includes an external connection pad 222A.

The solder resist layer 225 is formed on the insulating film 212 in a manner covering the wiring patterns 216-218 except for the areas where the pads 216A, 217A are formed. The solder resist layer 225 includes an opening part 225A exposing the pad 216A and an opening part 225B exposing the pad 217A.

The solder resist layer 226 is formed on the lower surface of the insulating film 212 in a manner covering the wiring patterns 221 and 222 except for the areas where the pads 221A, 222A are formed. The solder resist layer 226 includes an opening part 226A exposing the pad 221A and an opening part 226B exposing the pad 222A.

The electronic component 202 is connected to the pad 217A by flip-chip bonding. The electronic component 203 is connected to the pad 216A by flip-chip bonding. The electronic component 203 is electrically connected to the electronic component 202 via the wiring pattern 218.

The external connection terminal 205 is formed on the pad 221A. The external connection terminal 206 is formed on the pad 222A. The external connection terminals 205, 206 serve as terminals (e.g., solder balls) that are to be electrically connected to pads (not illustrated) of a target mounting substrate (not illustrated) when the semiconductor device 200 is mounted on the target mounting substrate (See, for example, Japanese Laid-Open Patent Application No. 2006-135174).

FIG. 2 is a schematic diagram for describing problems of a wiring substrate according to a related art example. In FIG. 2, like components are denoted with like reference numerals of the semiconductor device 200 of FIG. 1.

In a case where a substrate such as a silicon substrate, a compound (e.g., GaAs) semiconductor substrate, or a glass substrate (including a quartz glass substrate) is used as the substrate body 211, the substrate body 211 is more fragile compared to a resin substrate.

The outer peripheral part (including corner parts of the substrate body 211) of the substrate body 211 may be broken during handling (for example, the handling from completing the fabrication of the wiring substrate 11 to mounting the electronic components 12, 13 on the wiring substrate 11) of the wiring substrate 201. As a result, a chipped part(s) 250 may be formed in the substrate body 211 as illustrated in FIG. 2.

SUMMARY OF THE INVENTION

The present invention may provide a wiring substrate and a method of manufacturing the wiring substrate that substantially eliminates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a wiring substrate and a method of manufacturing the wiring substrate particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a wiring substrate including: a substrate body including a first surface and a second surface provided on an opposite side of the first surface, the substrate body including a substrate side surface; a penetration electrode penetrating through the substrate body; a first wiring pattern provided on the first surface, the first wiring pattern including a first pad; a second wiring pattern provided on the second surface, the second wiring pattern including a second pad; a first insulating resin layer covering the first wiring pattern except for an area corresponding to the first pad and having a first resin side surface; a second insulating resin layer covering the second wiring pattern except for an area corresponding to the second pad and having a second resin side surface that is flush with the first resin side surface; and a notch part encompassing at least a part of the substrate body and having a resin material provided therein; wherein the substrate side surface is located more inward than the first and second resin side surfaces.

Further, another embodiment of the present invention provides a method of manufacturing a wiring substrate, the method including the steps of: a) preparing a substrate main body including an upper surface and a lower surface provided on an opposite side of the upper surface and having a plurality of cutting areas and a plurality of substrate formation areas adjacent to the plural cutting areas; b) forming a groove at the upper surface of the substrate main body in the plural cutting areas and the substrate formation areas, the groove having a width a greater with than the width of the plural cutting areas; c) filling the groove with a resin material; d) forming a plurality of opening parts at the upper surface of the substrate main body in the substrate formation areas; e) filling the plural opening parts with a conductive material; f) forming a plurality of penetration electrodes penetrating through the substrate main body at areas corresponding to the opening parts by reducing the thickness of the substrate main body; g) forming a first wiring pattern including a first pad on a predetermined part of the upper surface of the substrate main body; h) forming a second wiring pattern including a second pad on a predetermined part of the lower surface of the substrate main body; i) forming a first insulating resin material on the first wiring pattern except for an area corresponding to the first pad and on an upper surface of the resin material; j) forming a second insulating resin material on the second wiring pattern except for an area corresponding to the second pad and on a lower surface of the resin material; and k) cutting the substrate main body into a plurality of substrate bodies by cutting the plural cutting areas corresponding to the groove filled with the resin material.

Further, another embodiment of the present invention provides a method of manufacturing a wiring substrate, the method including the steps of: a) preparing a substrate main body including an upper surface and a lower surface provided on an opposite side of the upper surface and having a plurality of cutting areas and a plurality of substrate formation areas adjacent to the plural cutting areas; b) forming a penetration groove penetrating through the substrate main body in the plural cutting areas and the substrate formation areas, the penetration groove having a width a greater with than the width of the plural cutting areas; c) filling the penetration groove with a resin material; d) forming a plurality of through-holes penetrating through the substrate main body in the substrate formation areas; e) forming a plurality of penetration electrodes penetrating through the substrate main body by filling the plural through-holes with a conductive material; f) forming a first wiring pattern including a first pad on a predetermined part of the upper surface of the substrate main body; g) forming a second wiring pattern including a second pad on a predetermined part of the lower surface of the substrate main body; h) forming a first insulating resin material on the first wiring pattern except for an area corresponding to the first pad and on an upper surface of the resin material; i) forming a second insulating resin material on the second wiring pattern except for an area corresponding to the second pad and on a lower surface of the resin material; and j) cutting the substrate main body into a plurality of substrate bodies by cutting the plural cutting areas corresponding to the groove filled with the resin material.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

First Embodiment

Figure 1:
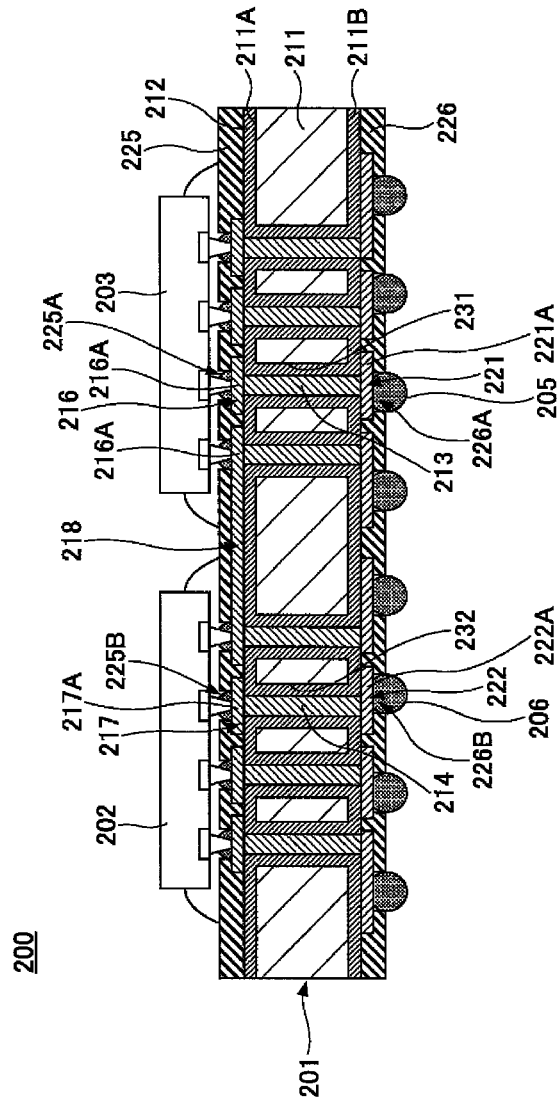
FIG. 1 is a cross-sectional diagram illustrating a semiconductor device according to a related art example.
Figure 2:
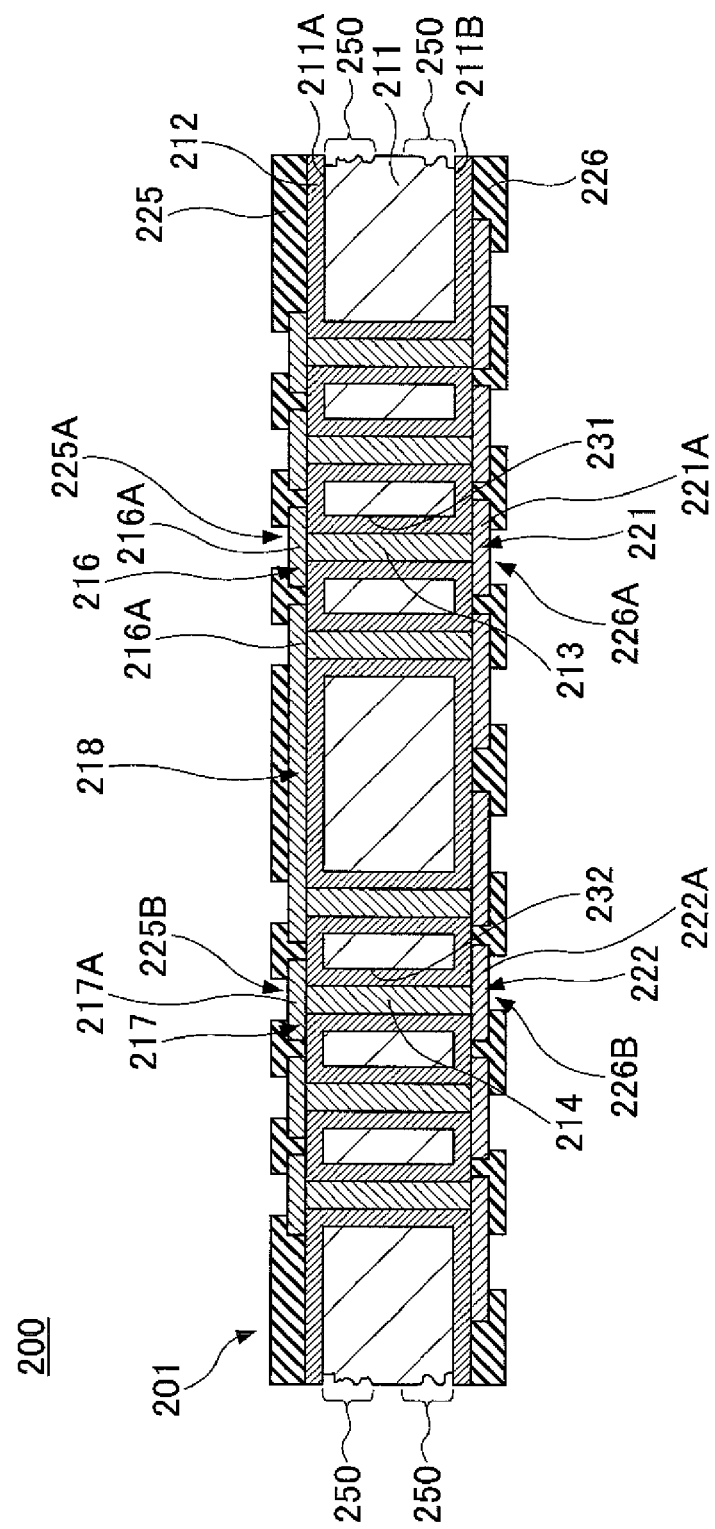
FIG. 2 is a schematic diagram for describing problems of a wiring substrate according to a related art example.
Figure 3:
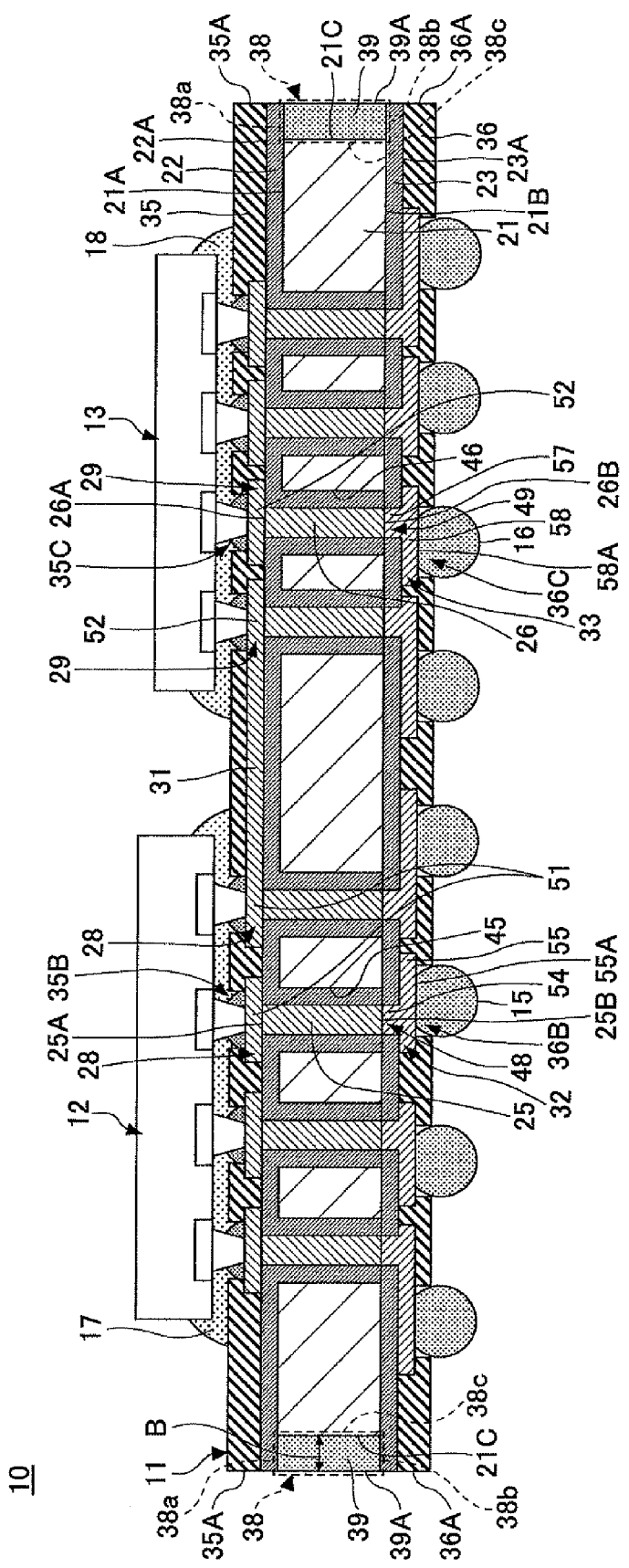
FIG. 3 is a cross-sectional diagram illustrating a semiconductor device according to a first embodiment of the present invention.

FIG. 3 is a cross-sectional diagram illustrating a semiconductor device 10 according to the first embodiment of the present invention. It is to be noted that the semiconductor device 10 may also be referred to as a "semiconductor package".

With reference to FIG. 3, the semiconductor device 10 includes a wiring substrate 11, electronic components 12 and 13, and external connection terminals 15, 16.

The wiring substrate 11 includes a substrate body 21, insulating films 22, 23, penetration electrodes 25, 26, first wiring patterns 28, 29, a wiring 31, second wiring patterns 32, 33, a first insulating resin layer 35, a second insulating resin layer 36, a notch part 38, and a resin material 39.

Figure 4:
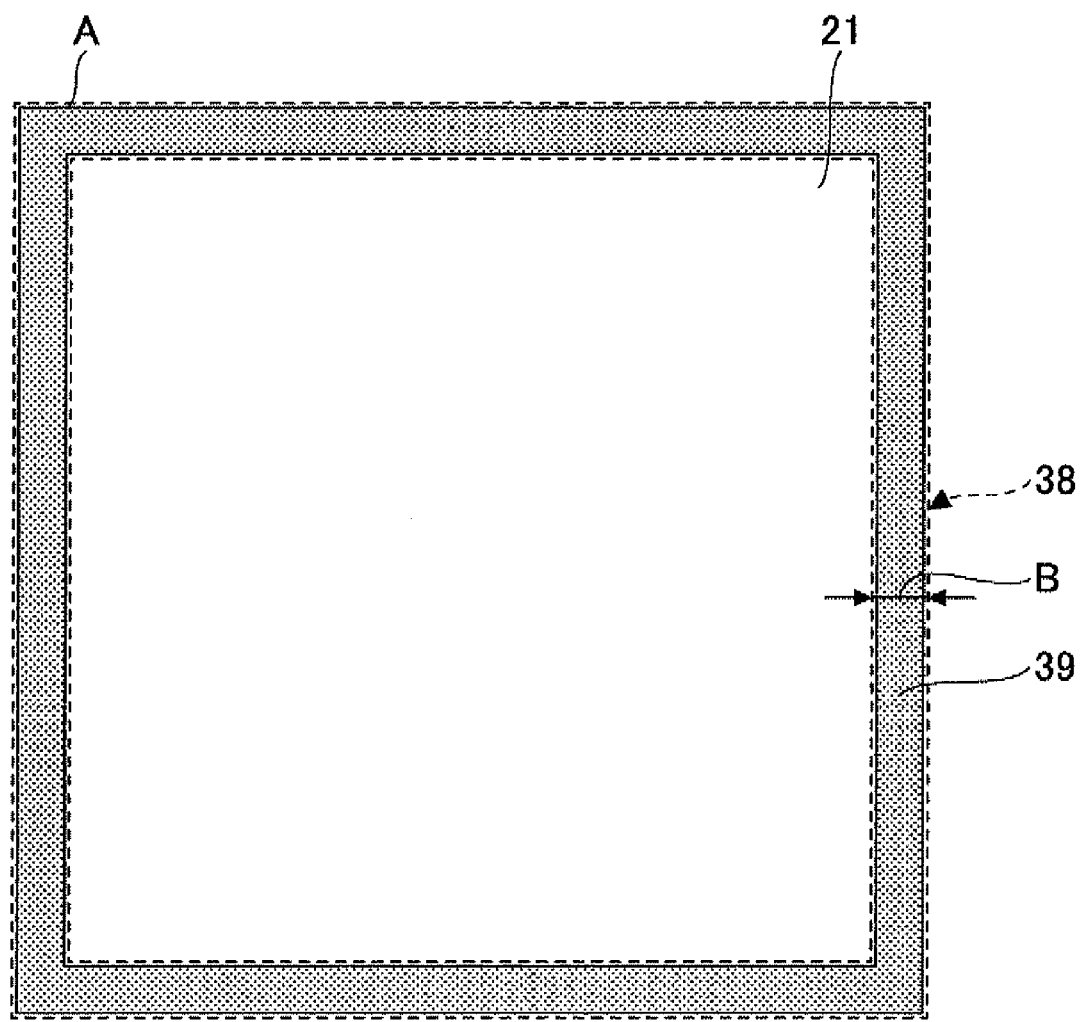
FIG. 4 is a schematic diagram for describing a notch part illustrated in FIG. 3.

FIG. 4 is a schematic diagram for describing the notch part 38 illustrated in FIG. 3. It is to be noted that FIG. 4 illustrates a plan view of only the notch part 38 containing the resin material 39 and the wiring substrate 11 for the sake of describing the shape of the notch part 38. The letter A illustrated in FIG. 4 represents the outer shape (hereinafter referred to as "outer shape A") of the wiring substrate 11.

With reference to FIGS. 3 and 4, the substrate body 21 has a planar shape. Further, the substrate body 21 is formed having an outer shape which is smaller than the outer shape A of the wiring substrate 11. As illustrated in FIG. 3, the substrate body 21 has an outer peripheral side 21C which is positioned more inward than an outer peripheral side 35A of the first insulating resin layer 35 (first outer peripheral side) and an outer peripheral side 36A of the second insulating resin layer 36 (second outer peripheral side).

The substrate body 21 includes through-holes 45, 46 penetrating the substrate body 21. The through-hole 45 is formed in a part of the substrate body 21 at which the penetration electrode 25 is to be formed. The through-hole 46 is formed in a part of the substrate body 21 at which the penetration electrode 26 is to be formed.

The material of the substrate body 21 may be, for example, a semiconductor material (e.g., silicon or a compound semiconductor material such as GaAs) or glass (including quartz glass).

In a case where a silicon substrate is used as the substrate body 21, the substrate body 21 can be formed with a thickness of, for example, 200 μm. In this embodiment, a silicon substrate is used the substrate body 21.

With reference to FIG. 3, the insulating film 22 is formed in a manner covering an upper surface 21A (first surface) of the substrate body 21 and the surfaces of the substrate body 21 facing the side surfaces of the through-holes 45, 46. A thermal oxide film or an oxide film (e.g., oxide film formed by a CVD (Chemical Vapor Deposition) method) may be used as the insulating film 22.

The insulating film 23 is provided in a manner covering a lower surface 21B (second surface) of the substrate body 21. The insulating film 23 includes an opening part 48 exposing an end surface (lower end surface) 25B of the penetration electrode 25 and an opening part 49 exposing an end surface (lower end surface) 26B of the penetration electrode 26. An oxide film (e.g., oxide film formed by a CVD method) or an insulating resin film may be used as the insulating film 23. More specifically, for example, an $SiO_2$ film may be used as the insulating film 23. In a case where the $SiO_2$ film is Used as the insulating film 23, the insulating film 23 can be formed having a thickness of, for example, 1 μm.

The penetration electrodes 25, 26 are provided in the through-holes 45, 46 having the insulating film 22 formed therein. End surfaces (upper end surfaces) 25A, 26A of the penetration electrodes 25, 26 are formed substantially flush with an upper surface 22A of the insulating film 22. The end surfaces 25B, 26B of the penetration electrode 25, 26 are formed substantially flush with the lower surface 21B of the substrate body 21. For example, Cu may be used as the material of the penetration electrodes 25, 26.

The first wiring pattern 28 may be provided on the upper surface 22A of the insulating film 22 formed on the upper surface 21A of the substrate body 21. The first wiring pattern 28 includes a pad 51 to which the electronic component 12 is connected. The first wiring pattern 28 electrically connects the electronic component 12 and the penetration electrode 25.

The first wiring pattern 29 may be provided on the upper surface 22A of the insulating film 22 formed on the upper surface 21A of the substrate body 21. The first wiring pattern 29 includes a pad 52 to which the electronic component 13 is connected. The first wiring pattern 29 electrically connects the electronic component 13 and the penetration electrode 26.

The wiring 31 is provided on a part of the upper surface 22A of the insulating film 22 located between an area on which the electronic component 12 is mounted and an area on which the electronic component 13 is mounted. One end part of the wiring pattern 31 is connected to the first wiring pattern 28. The other end part of the wiring 31 is connected to the first wiring pattern 29.

For example, Cu may be used as the material of the first wiring patterns 28, 29 and the wiring 31. Further, the first wiring patterns 28, 29 and the wiring 31 may be formed with a semi-additive method.

The second wiring pattern 32 includes a via plug 54 and an external connection pad 55. The via plug 54 is provided in the opening part 48. The via plug 54 is connected to the lower end surface 25B of the penetration electrode 25. Thereby, the via plug 54 is electrically connected to the first wiring pattern 28 via the penetration electrode 25.

The external connection pad 55 is provided in a lower surface 23A of the insulating film 23. The external connection pad 55 is integral with the via plug 54 (i.e. the external connection pad 55 and the via plug 54 form a united body). The external connection pad 55 is electrically connected to the first wiring pattern 28. The external connection pad 55 includes a connection surface 55A to which the external connection terminal 15 is mounted.

The second wiring pattern 33 includes a via plug 57 and an external connection pad 58. The via plug 57 is provided in the opening part 49. The via plug 57 is connected to the end surface 26B of the penetration electrode 26. Thereby, the via plug 57 is electrically connected to the first wiring pattern 29 via the penetration electrode 26.

The external connection pad 58 is provided on the lower surface 23A of the insulating film 23. The external connection pad 58 is formed integral with the via plug 57. The external connection pad 58 is electrically connected to the first wiring pattern 29 via the via plug 57 and the penetration electrode 26. The external connection pad 58 includes a connection surface 58A to which the external connection terminal 16 is mounted.

For example, Cu may be used as the material of the second wiring patterns 32, 33. Further, the second wiring patterns 32, 33 may be formed by, for example, a semi-additive method.

The first insulating resin layer 35 is provided on the upper surface 22A of the insulating film 22 in a manner covering the first wiring patterns 28, 29 and the wiring 31 except at the areas corresponding to the pads 51, 52. The first insulating resin layer 35 includes an opening part 35B exposing the pad 51 and an opening part 35C exposing the pad 52. For example, a solder resist layer may used to act as the first insulating resin layer 35.

The second insulating resin layer 36 is provided on the lower surface 23A of the insulating film 23 in a manner covering the second wiring patterns 32, 33 except at the areas corresponding to the external connection pads 55, 58. The second insulating resin layer 36 includes an opening part 36B exposing the connection surface 55A of the external connection pad 55 and an opening part 36C exposing the connection surface 58A of the external connection pad 58. The second insulating resin layer 36 has an outer shape which is substantially the same as the outer shape of the first insulating resin layer 35. Further, the outer peripheral side 36A of the second insulating resin layer 36 and the outer peripheral side 35A of the first insulating resin layer 35 are positioned at substantially on the same plane. For example, a solder resist layer may be used to act as the second insulating resin layer 36.

With reference to FIGS. 3 and 4, the notch part 38 is formed at an outer peripheral area of the substrate body 21 encompassing the substrate body 21. In this embodiment, the notch part 38 is formed as a single notch having a frame-like shape from a plan view (see FIG. 4). In this embodiment, the notch part 38 is a single recess defined by first-third inner surfaces 38a, 38b, and 38c. The first and second inner surface 38a, 38b are positioned facing each other in a vertical direction (i.e. thickness direction of the wiring substrate 11) and are connected via the third inner surface 38c. The third inner surface 38c is substantially in plane with the outer peripheral surface 21C of the substrate body 21 provided more inward than the outer peripheral side surfaces 35A, 36A of the first and second insulating resin layers 35, 36. The notch part 38 can be formed having a width B of, for example, 100 μm.

The resin material 39 is provided in the notch part 38 in a manner covering the outer peripheral surface 21C of the substrate body 21. The resin material 39 is formed having substantially the same shape as the notch part 38.

Accordingly, the outer peripheral area of the fragile substrate body 21 can be protected by the resin material 39 by forming the notch part 38 by forming the outer peripheral side surface 21C of the substrate body 21 at a position more inward than a position of the outer peripheral side surfaces 35A, 36A of the first and second insulating resin layers 35, 36 and providing the resin material 39 in the notch part 38 in a manner covering the outer peripheral side surface 21C of the substrate body 21. Thereby, the outer peripheral area of the substrate body 21 can be prevented from being damaged (broken) during handling of the wiring substrate 11.

Further, it is preferable to arrange an outer peripheral side surface 39A of the resin material 39 in a manner substantially flush with the outer peripheral side surfaces 35A, 36A of the first and second insulating resin layers 35, 36. Further, it is preferable to arrange the outer peripheral side surface 39A of the resin material more inward than the outer side surfaces 35A, 36A of the first and second insulating resin layers 35, 36. Thus, by arranging the outer peripheral side surface 39A of the resin material 39 in a manner substantially flush with the outer peripheral side surfaces 35A, 36A of the first and second insulating resin layers 35, 36 and/or by arranging the outer peripheral side surface 39A of the resin material more inward than the outer peripheral side surfaces 35A, 36A of the first and second insulating resin layers 35, 36, the outer peripheral area of the substrate body 21 can be prevented from being broken without having to significantly increase the size of the substrate body 11 in the plane direction.

For example, epoxy resin, polyimide resin, or silicone resin may be used as the resin material 39.

In this embodiment, the electronic component 12 is connected to the pad 51 by flip-chip bonding. Then, the space between the electronic component 12 and the wiring substrate 11 is filled with an underfill resin material 17. The electronic component 12 may be, for example, a semiconductor chip.

The electronic component 13 is connected to the pad 52 by flip-chip bonding. An underfill resin material 18 is filled in the space between the electronic component 13 and the wiring substrate 11. In this embodiment, the electronic component 13 is an electronic component that releases a greater amount of heat during operation compared to that of the electronic component 12. The electronic component 13 may be, for example, a semiconductor chip.

The external connection terminal 15 is mounted on the connection surface 55A of the external connection pad 55. The external connection terminal 15 is electrically connected to the electronic component 12. In this embodiment, the external connection terminal 15 is a terminal connected to a pad of a target mounting substrate (not illustrated) such as a motherboard. For example, a solder ball may be used as the external connection terminal 15.

The external connection terminal 16 is mounted on the connection surface 58A of the external connection pad 58. The external connection terminal 16 is electrically connected to the electronic component 13. In this embodiment, the external connection terminal 16 is a terminal connected to a pad of a target mounting substrate (not illustrated) such as a motherboard. For example, a solder ball may be used as the external connection terminal 16.

With the above-described embodiment of the wiring substrate 11, the outer peripheral area of the substrate body 21 having a breakable characteristic can be protected by the resin material 39 by forming the notch part 38 by forming the outer peripheral side surface 21C of the substrate body 21 at a position more inward than a position of the outer peripheral side surfaces 35A, 36A of the first and second insulating resin layers 35, 36 and providing the resin material 39 in the notch part 38 in a manner covering the outer peripheral side surface 21C of the substrate body 21. Thereby, the outer peripheral area of the substrate body 21 can be prevented from being damaged (broken) during handling of the wiring substrate 11.

The processes of manufacturing the semiconductor device 10 according to an embodiment of the present invention are described with reference to FIGS. 5-21. In FIGS. 5-21, like parts and components are denoted by like reference numerals as of the above-described embodiment of the semiconductor device 10.

Figure 5:
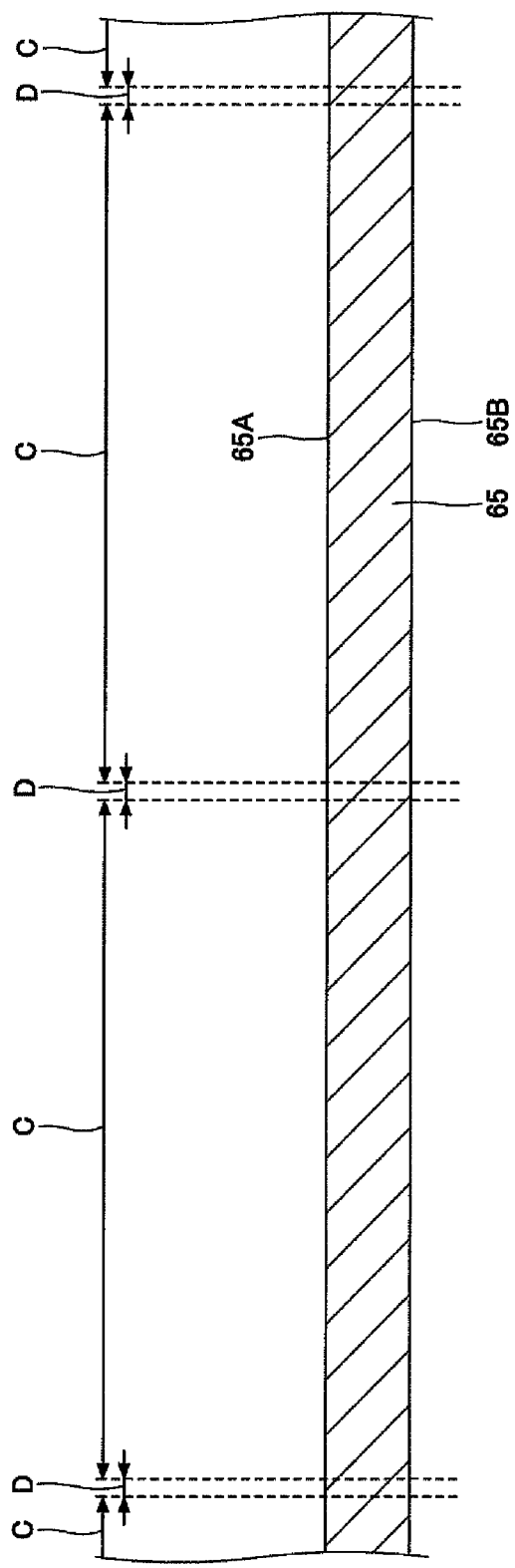
FIG. 5 is a schematic diagram illustrating a step of a method of manufacturing a semiconductor device according to the first embodiment of the present invention (part 1)

First, in the step illustrated in FIG. 5, a substrate main body 65 is prepared (preparation step). The substrate main body 65 includes plural wiring substrate regions (substrate formation areas) C and dicing regions (cutting areas) D arranged in a manner encompassing the plural wiring substrate regions C. The wiring substrates 11 are to be formed in the wiring substrate regions C.

As described below, the substrate main body 65 is to be formed into a thin shape in a subsequent thickness reducing (thinning) process of FIG. 14 (thickness reduction step). After the thickness reduction step, the substrate body 65 is subjected to the below-described cutting process of FIG. 20 (cutting step). By cutting the substrate main body 65, plural substrate bodies 21 are obtained. The obtained substrate body 21 is one of the elements of the wiring substrate 11 according to an embodiment of the present invention.

For example, a semiconductor material (e.g., silicon or a compound semiconductor material such as GaAs) or a glass material (including a quartz glass material) may be used as the material of the substrate main body 65. At this stage, the substrate main body 65 has a thickness greater than that of the substrate body 21. In a case where the thickness of the substrate body 21 formed of silicon is 200 μm, the thickness of the substrate main body 65 may be, for example, 725 μm. The width of the cutting region D may be, for example, 50 μm. In this embodiment, a silicon wafer is used as the substrate main body 65.

Figure 6:
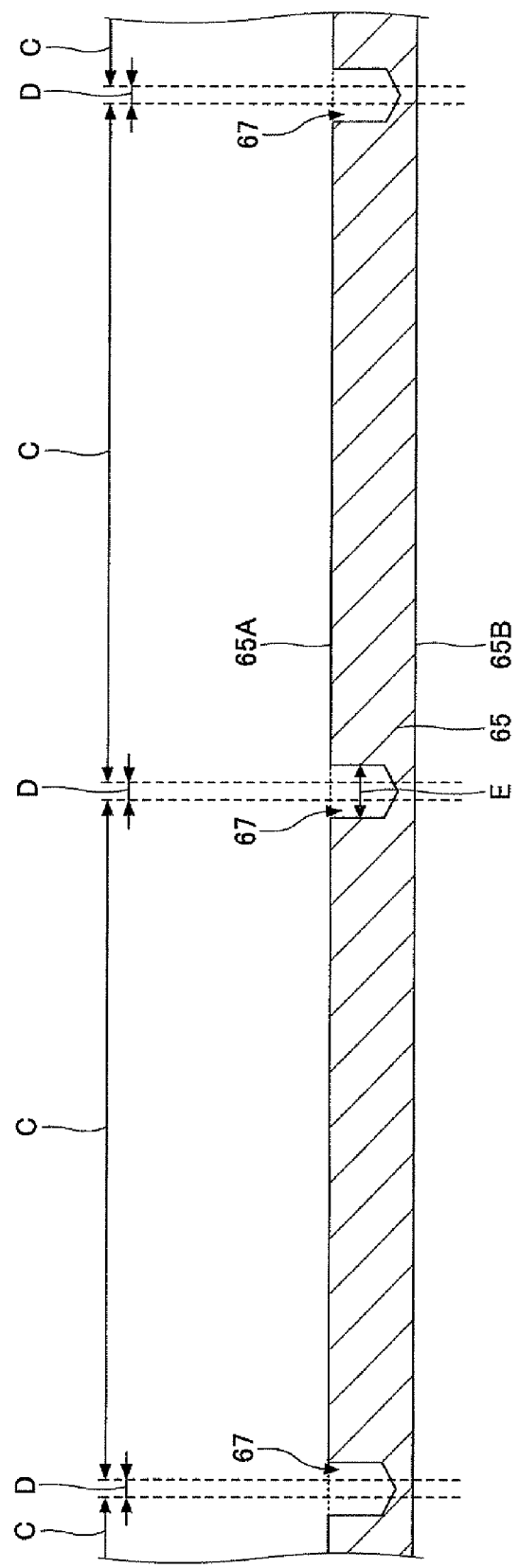
FIG. 6 is a schematic diagram illustrating a step of a method of manufacturing a semiconductor device according to the first embodiment of the present invention (part 2)

Then, in the step illustrated in FIG. 6, groove 67 is formed in the cutting region D and in the plural wiring substrate regions C adjacent to the dicing region D (groove forming step). The groove 67 has a width greater than the width of the cutting region D. The groove 67 partly penetrates the substrate main body 65 from the upper surface 65A of the substrate main body 65. For example, the groove 67 may be formed by dicing a corresponding part of the substrate main body 65. In this embodiment where the width of the cutting region D is 50 μm and the thickness of the resin material 39 of the wiring substrate 11 is 300 μm, the width E of the groove 67 is, for example, 250 μm.

As described below, the substrate main body 65 is to be formed into a thin shape in a subsequent thickness reducing (thinning) process of FIG. 14 (thickness reduction step). After the thickness reduction step, the substrate body 65 is subjected to the below-described cutting process of FIG. 20 (cutting step). By cutting the substrate main body 65, the notch part 38 (see, for example, FIG. 3) is obtained. The obtained notch part 38 is one of the elements of the wiring substrate 11 according to an embodiment of the present invention.

Figure 7:
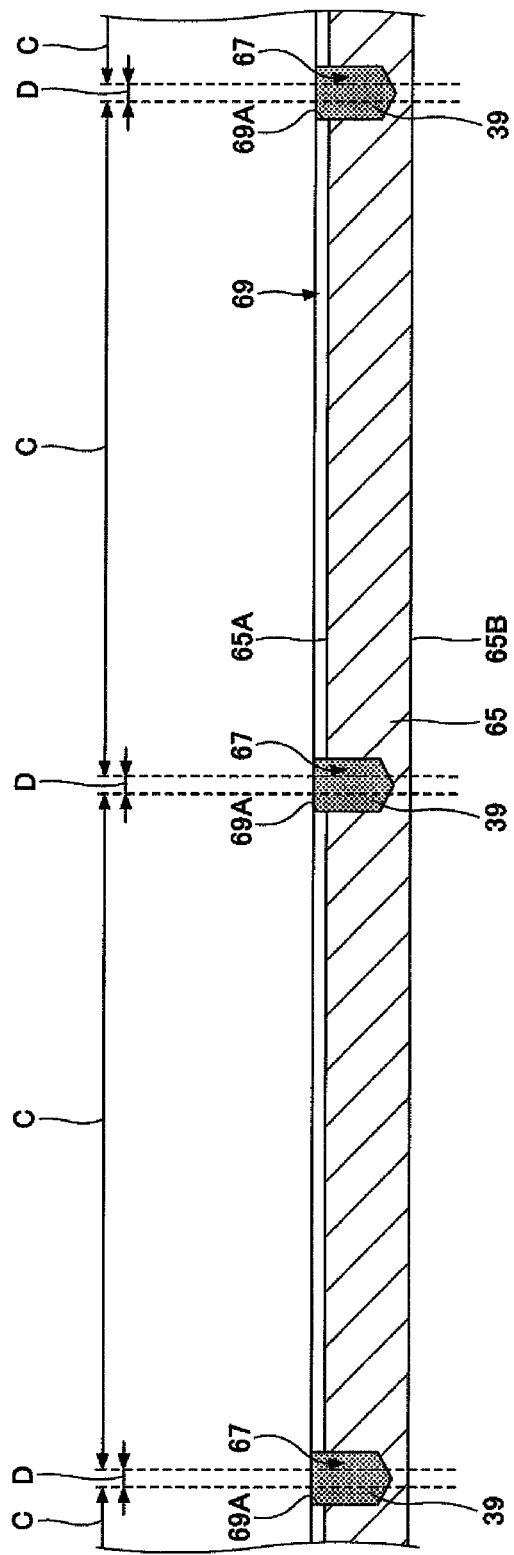
FIG. 7 is a schematic diagram illustrating a step of a method of manufacturing a semiconductor device according to the first embodiment of the present invention (part 3)

Then, in the step illustrated in FIG. 7, a mask 69 having a penetration groove 69A is formed on the upper surface 65A of the substrate main body 65. The penetration groove 69A of the mask 69 is formed in corresponding with the groove 67 for allowing the groove 67 to be exposed. Then, the groove 67 is filled with the resin material 39 (resin filling step).

More specifically, in one example, the mask 69 is formed by adhering a resin film to the upper surface 65A of the substrate main body 65 and irradiating a laser to a part of the resin film corresponding to the area of the penetration groove 69. The thickness of the mask is, for example, 20 μm.

The groove 67 is filled with the resin material 39 by using, for example, a squeegee printing method. Because the penetration groove 69A of the mask 69 also becomes filled with the resin material 39 by performing the filling step, residual resin material 39 is to be removed in a subsequent step illustrated in FIG. 9. For example, epoxy resin, polyimide resin, or silicone resin may be used as the resin material 39.

Figure 8:
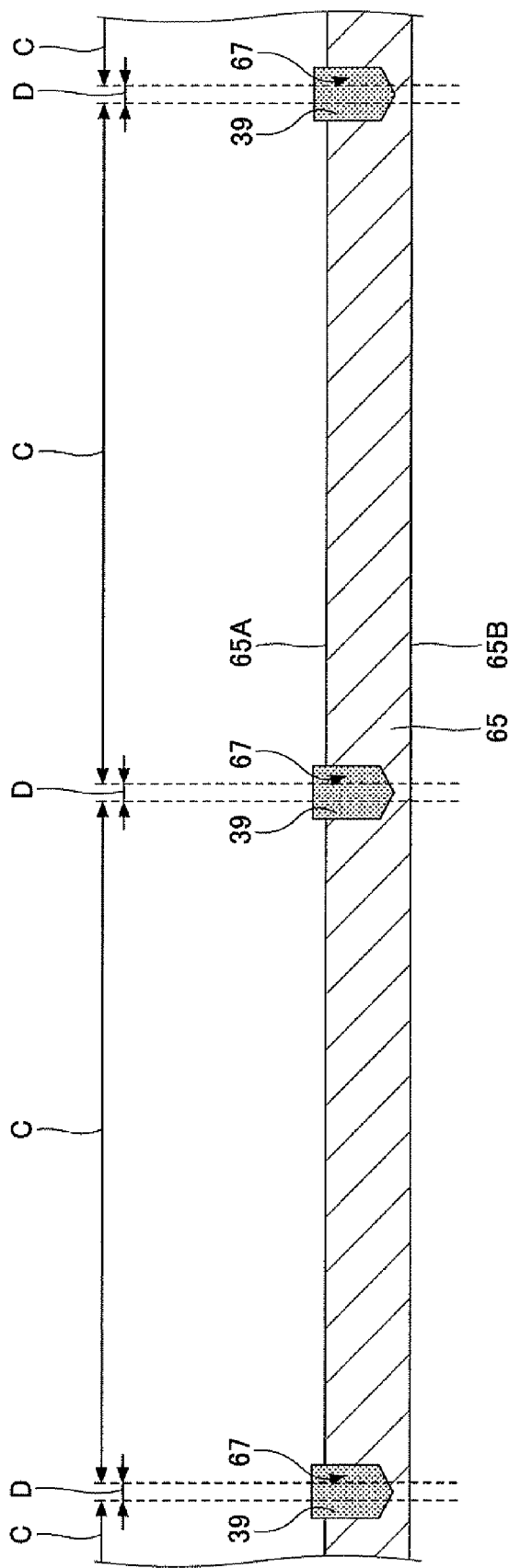
FIG. 8 is a schematic diagram illustrating a step of a method of manufacturing a semiconductor device according to the first embodiment of the present invention (part 4)

Then, the mask 69 is removed in the step illustrated in FIG. 8. More specifically, in one example, the mask 69 is removed by using mono-ethanol-amine release liquid.

Figure 9:
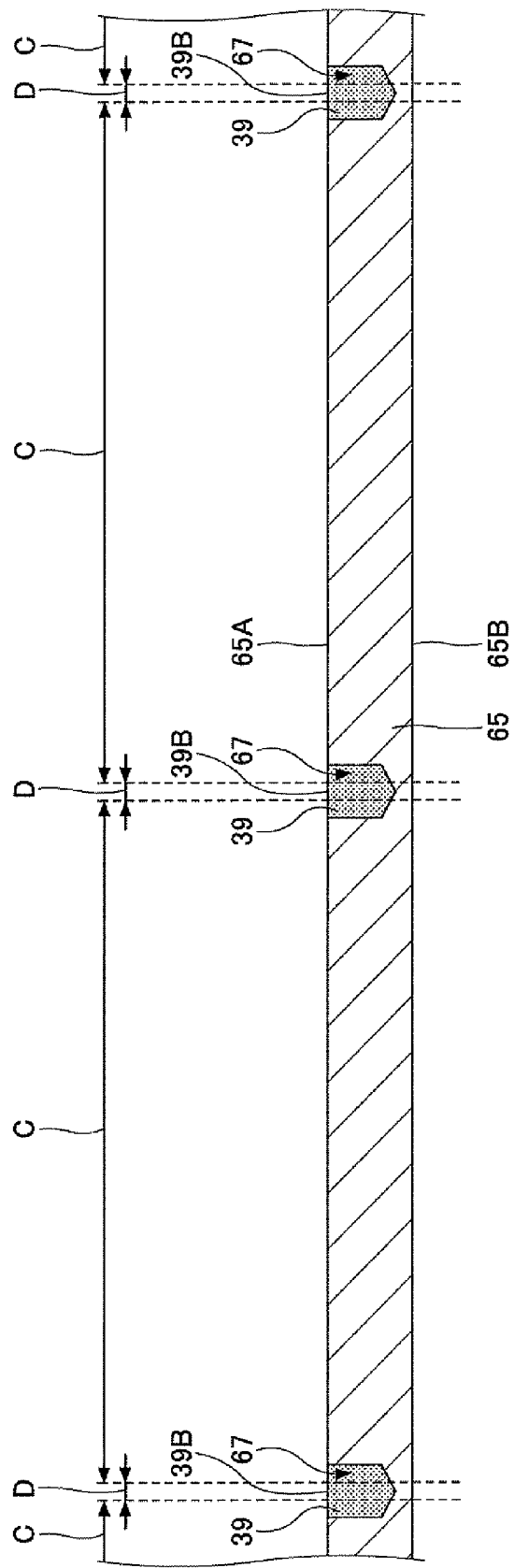
FIG. 9 is a schematic diagram illustrating a step of a method of manufacturing a semiconductor device according to the first embodiment of the present invention (part 5)

Then, a portion of the resin material 39 projecting from the upper surface 65A of the substrate main body 65 is removed in the step illustrated in FIG. 9 (resin removing step). Thereby, an upper surface 39B of the resin material 39 and the upper surface 65A of the substrate main body 65 become substantially flush. More specifically, in one example, the portion of the resin material 39 projecting from the upper surface 65A of the substrate main body 65 is removed by polishing.

Figure 10:
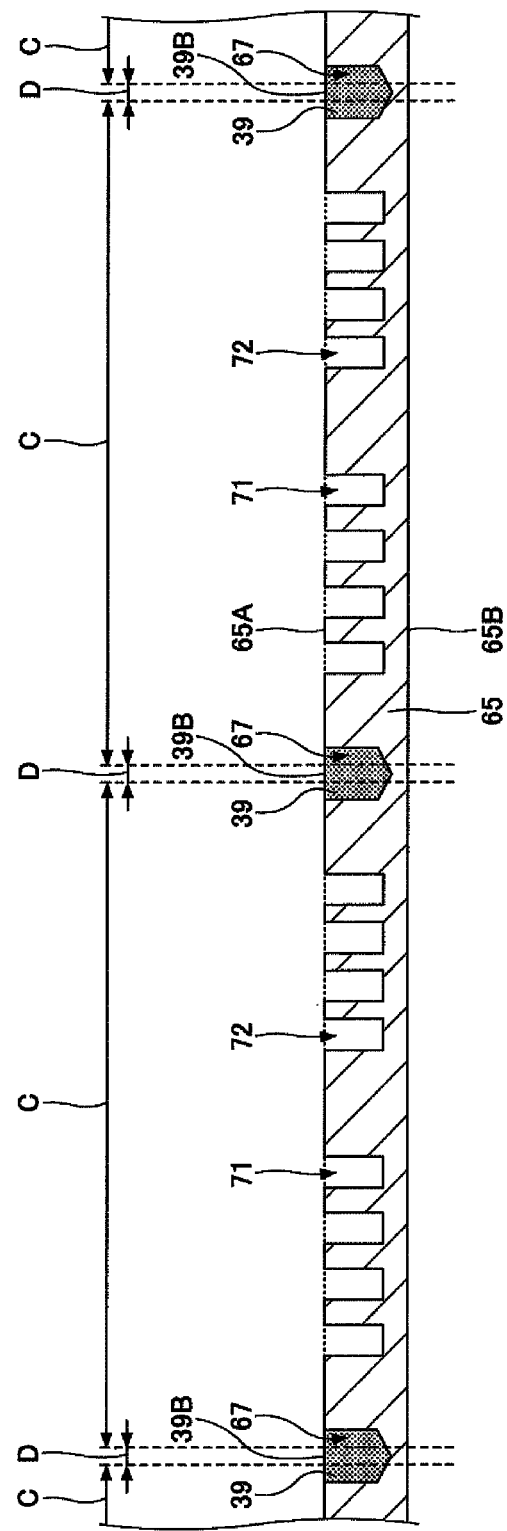
FIG. 10 is a schematic diagram illustrating a step of a method of manufacturing a semiconductor device according to the first embodiment of the present invention (part 6)

Then, in the step illustrated in FIG. 10, plural opening parts 71, 72 are formed on the upper surface 65A of the substrate main body 65. The opening parts 71, 72 are formed in the plural wiring substrate regions C. The opening parts 71, 72 partly penetrate the substrate main body 65 (opening part forming step). More specifically, in one example, the opening parts 71, 72 are formed by performing an anisotropic etching process (e.g., dry etching) on parts of the substrate main body 65 in the plural wiring substrate regions C. The opening parts 71 are formed in parts of the substrate main body 65 corresponding to the areas where the penetration electrodes 25 are to be formed. The opening parts 72 are formed in parts of the substrate main body 65 corresponding to the areas where the penetration electrodes 26 are to be formed. In a case where the thickness of the substrate main body 65 is 725 μm, the opening parts 71, 72 are formed having a depth of, for example, 220 μm.

Figure 14:
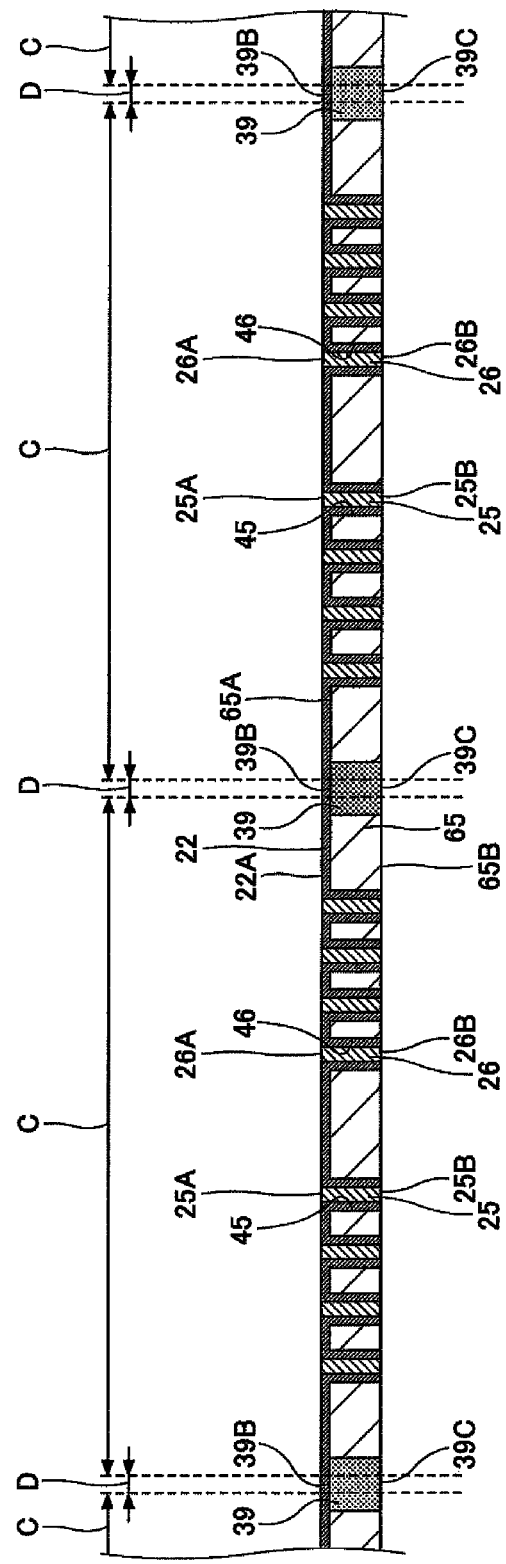
FIG. 14 is a schematic diagram illustrating a step of a method of manufacturing a semiconductor device according to the first embodiment of the present invention (part 10)

The opening parts 71 become the through-holes 45 of FIG. 3 by reducing the thickness of the substrate main body 65 in a subsequent thickness reduction step of FIG. 14. Further, the opening parts 72 become the through-holes 46 of FIG. 3 by reducing the thickness of the substrate main body 65 in a subsequent thickness reduction step of FIG. 14.

Figure 11:
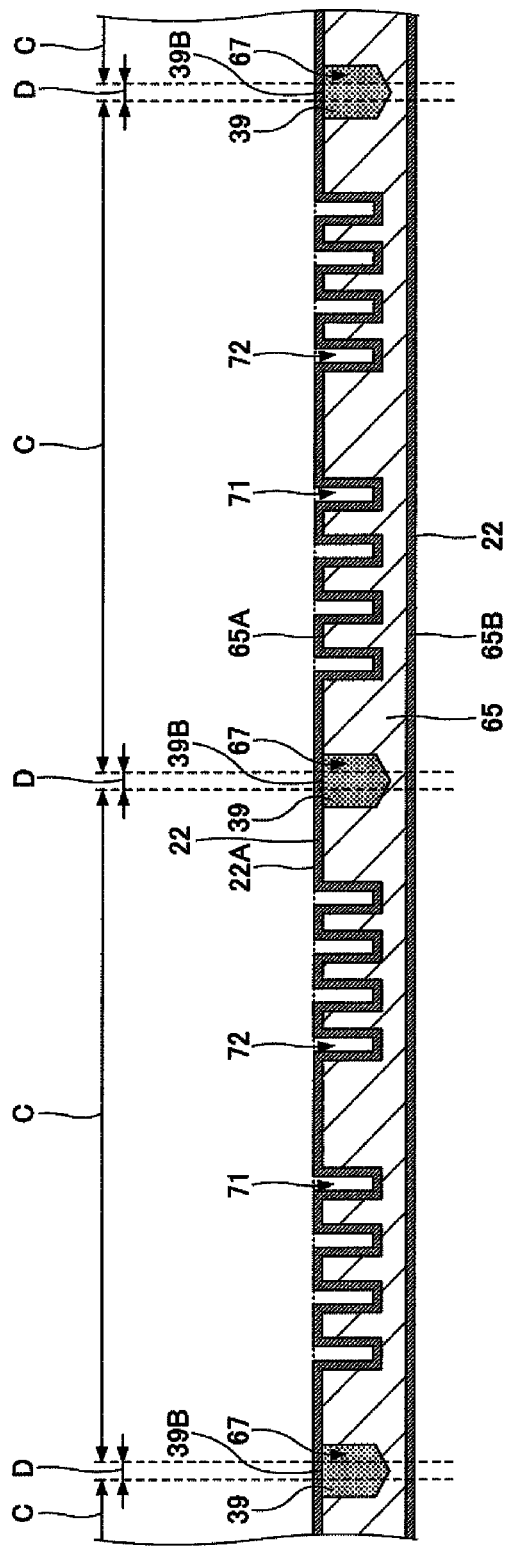
FIG. 11 is a schematic diagram illustrating a step of a method of manufacturing a semiconductor device according to the first embodiment of the present invention (part 7)

Then, the insulating film 22 is formed in the step illustrated in FIG. 11. The insulating film 22 covers the surface of the substrate main body 65 (including upper and lower surfaces 65A, 65B of the substrate main body 65 and areas of the substrate at which the opening parts 71, 72 are formed) and the upper surface 39B of the resin material 39.

For example, an oxide film formed by a CVD method may be used as the insulating film 22. More specifically, in one example, $SiO_2$ may be used as the insulating film 22. In this example, the insulating film 22 may have a thickness of 1 μm.

Figure 12:
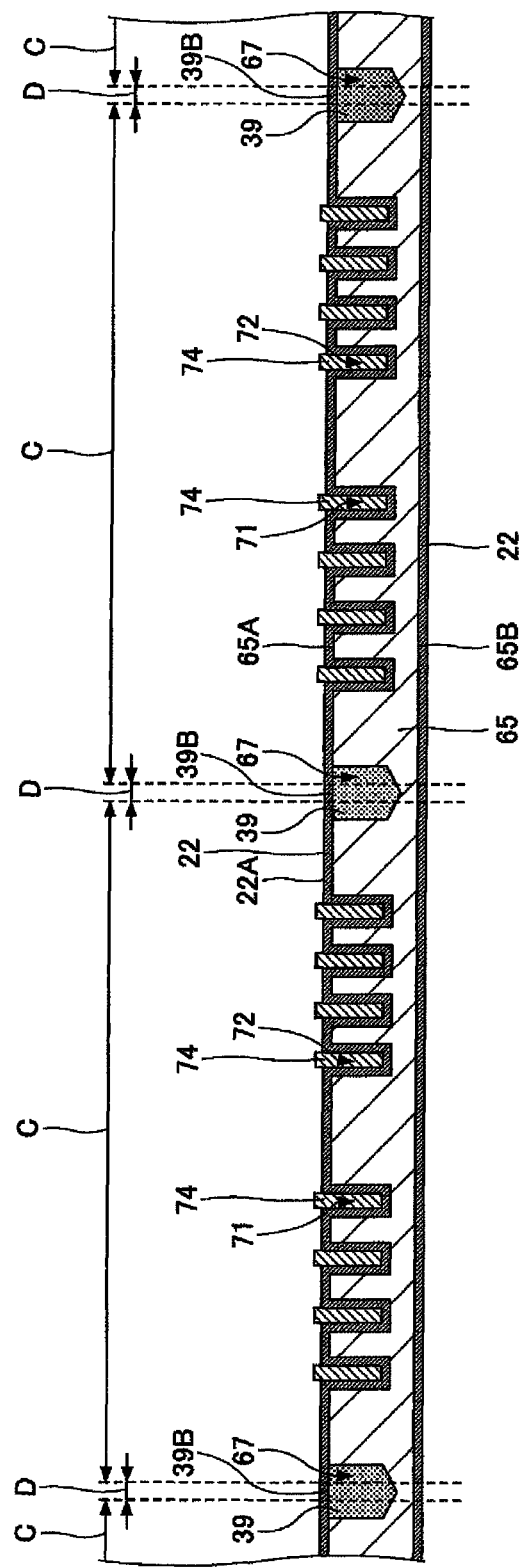
FIG. 12 is a schematic diagram illustrating a step of a method of manufacturing a semiconductor device according to the first embodiment of the present invention (part 8)

Then, in the step illustrated in FIG. 12, the opening parts 71, 72 are filled with conductive material 74 which is to be the base material of the penetration electrode 25, 26 (conductive material filling step). More specifically, in one example, the opening parts 71, 72 are filled with the conductive material 74 by depositing and growing a Cu plating film by using a semi-additive method. In another example, the opening parts 71, 72 are filled with a conductive paste (e.g., Cu paste, Ag paste, Ni paste) by using a printing method. In this example, the conductive material 74 may sometimes project from the upper surface 22A of the insulating film 22.

Figure 13:
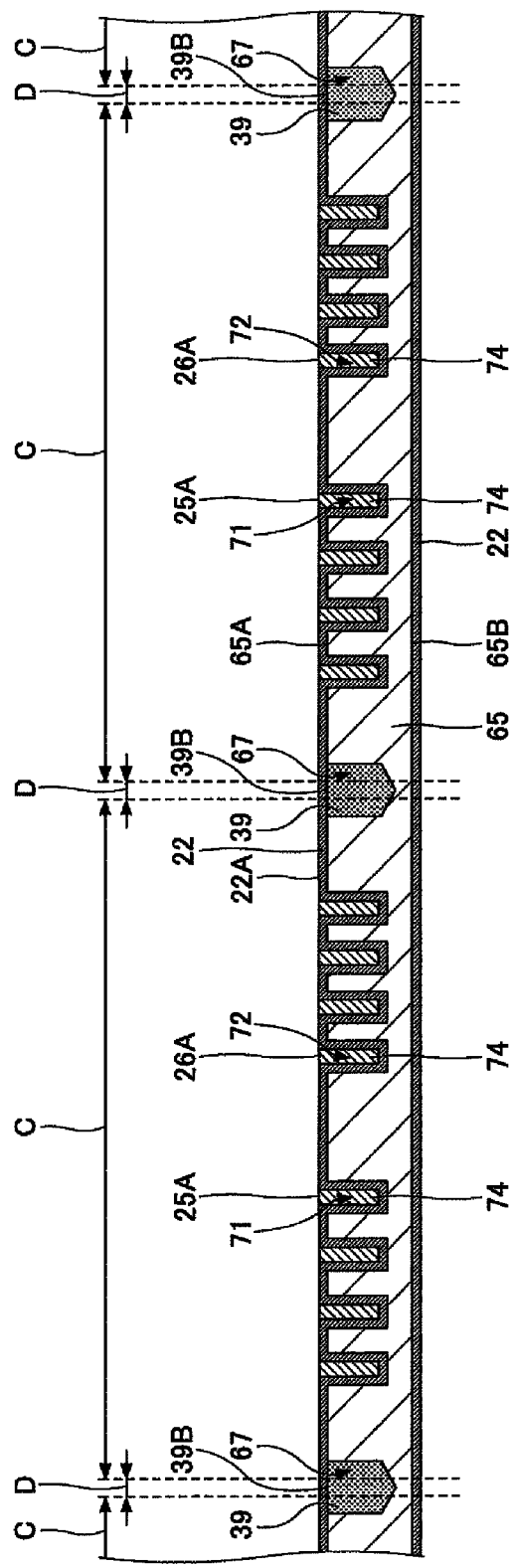
FIG. 13 is a schematic diagram illustrating a step of a method of manufacturing a semiconductor device according to the first embodiment of the present invention (part 9)

Then, in the step illustrated in FIG. 13, the conductive material 74 projecting from the upper surface 22A of the insulating film 22 is removed (conductive material removing step). In one example, by performing a polishing process using a polishing liquid, only the conductive material 74 projecting from the upper surface 22A of the insulating film 22 can be removed.

Accordingly, the upper end surface 25A of the conductive material 74 provided in the opening part 71, the upper end surface 26A of the conductive material 74 provided in the opening part 74, and the upper surface 22A of the insulating film 22 become substantially flush. This enables the first wiring patterns 28, 29, and the wiring 31 to be formed on the upper side of the configuration illustrated in FIG. 13.

Then, in the step illustrated in FIG. 14, the thickness reduction process is performed on the lower surface 65B of the substrate main body 65 illustrated in FIG. 13. The thickness of the substrate main body 65 is reduced until the lower portion of the conductive material 74 (penetration electrodes 25, 26) and the lower portion of the resin material 39 are exposed (substrate thickness reduction step). Thereby, the resin material 39 completely penetrating the substrate main body 65 from the upper surface 65A to the lower surface 65B and the penetration electrodes 25, 26 containing the conductive material 74 are formed.

In one example, the thickness of the substrate main body 65 is reduced by performing a grinding process or a polishing process on the lower surface 65B of the substrate main body 65 of FIG. 13. By performing the grinding process or the polishing process, the insulating film 22 formed on the lower surface 65B of the substrate main body 65 of FIG. 13 is removed. Accordingly, the end surfaces 25B, 26B of the penetration electrodes 25, 26, a lower surface 39C of the resin material 39, and the lower surface 65B of the substrate main body 65 become substantially flush. In this example, the substrate main body 65 has its thickness reduced to, for example, 200 μm.

Figure 15:
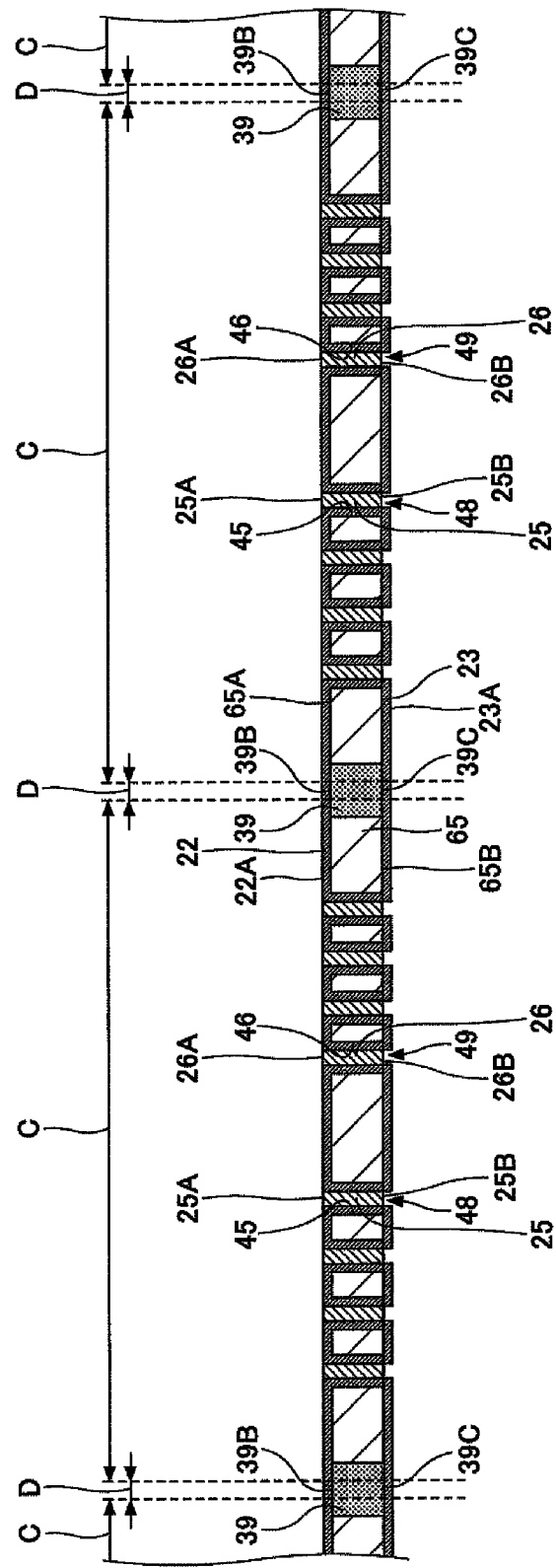
FIG. 15 is a schematic diagram illustrating a step of a method of manufacturing a semiconductor device according to the first embodiment of the present invention (part 11)

Then, in the step illustrated in FIG. 15, the insulating film 23 is formed on the lower surface 655 of the substrate main body 65 of FIG. 14. The insulating film 23 is formed having opening parts 48 and 49 that expose corresponding end surfaces 25B, 26B of the penetration electrodes 25, 26. The insulating film 23 may be an oxide film or an insulating resin layer (a layer formed of, for example, epoxy resin, polyimide resin, or silicone resin) formed by a CVD method. More specifically, in one example, the insulating film 23 may be an $SiO_2$ film. In this example, the thickness of the insulating film 23 may be, for example, 1 μm. The opening parts 48, 49 may be formed by, for example, an anisotropic etching process (e.g., dry-etching) or a laser irradiating process.

Figure 16:
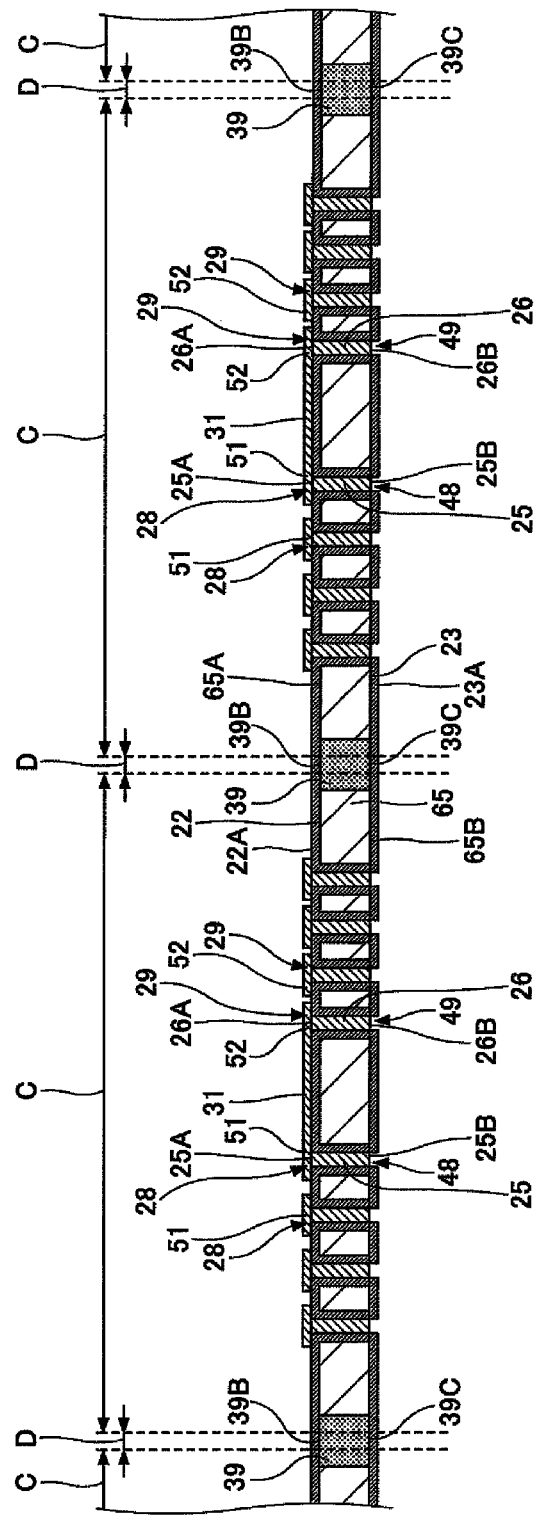
FIG. 16 is a schematic diagram illustrating a step of a method of manufacturing a semiconductor device according to the first embodiment of the present invention (part 12)

Then, in the step illustrated in FIG. 16, the first wiring patterns 28, 29 and the wiring 31 are simultaneously formed on predetermined parts of the upper surface 22A of the insulating film 22 (first wiring pattern forming step). The first wiring pattern 28 is connected to the upper end (end surface 25A) of the penetration electrode 25. The first wiring pattern 29 is connected to the upper end (end surface 26A) of the penetration electrode 26. In one example, the first wiring patterns 28, 29 and the wiring 31 are formed by using a semi-additive method. For example, Cu may be used as the material of the first wiring patterns 28, 29 and the wiring 31.

Figure 17:
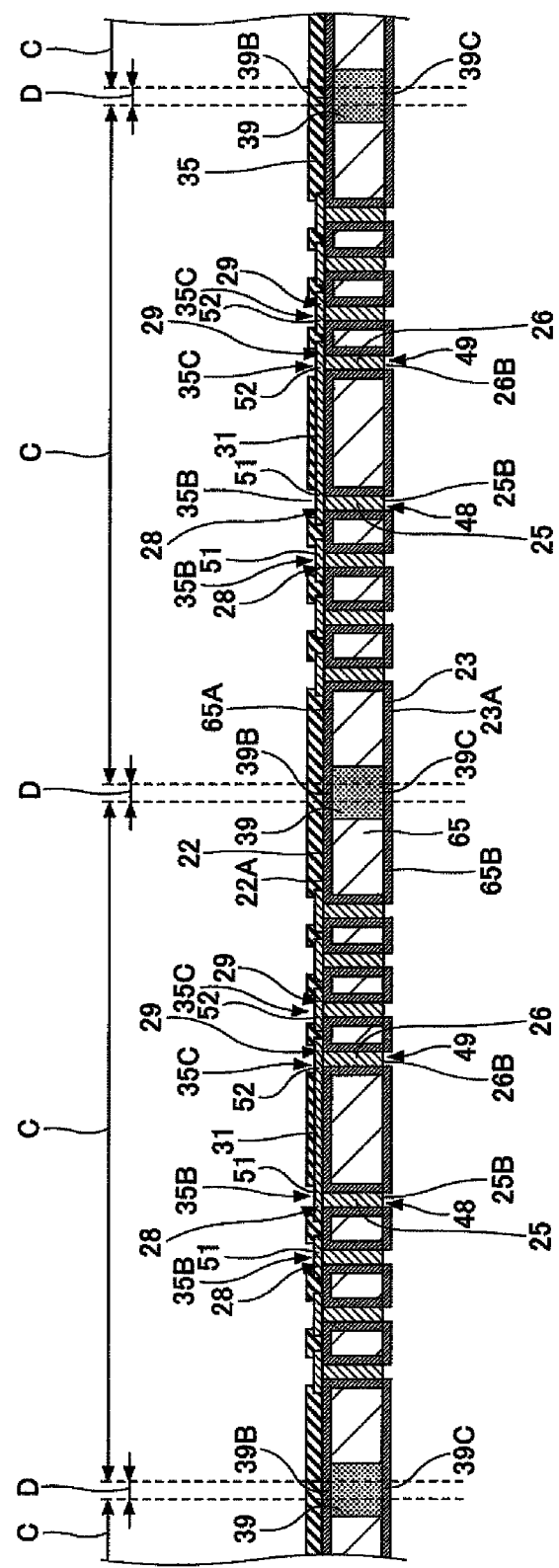
FIG. 17 is a schematic diagram illustrating a step of a method of manufacturing a semiconductor device according to the first embodiment of the present invention (part 13)

Then, in the step illustrated in FIG. 17, the first insulating resin layer 35 is formed on predetermined parts of the upper surface 22A of the insulating film 22 (first insulating resin layer forming step). The first insulating resin layer 35 includes the opening part 35B exposing the pad 51 and the opening part 35C exposing the pad 52. For example, a solder resist layer may be used as the first insulating resin layer 35.

Figure 18:
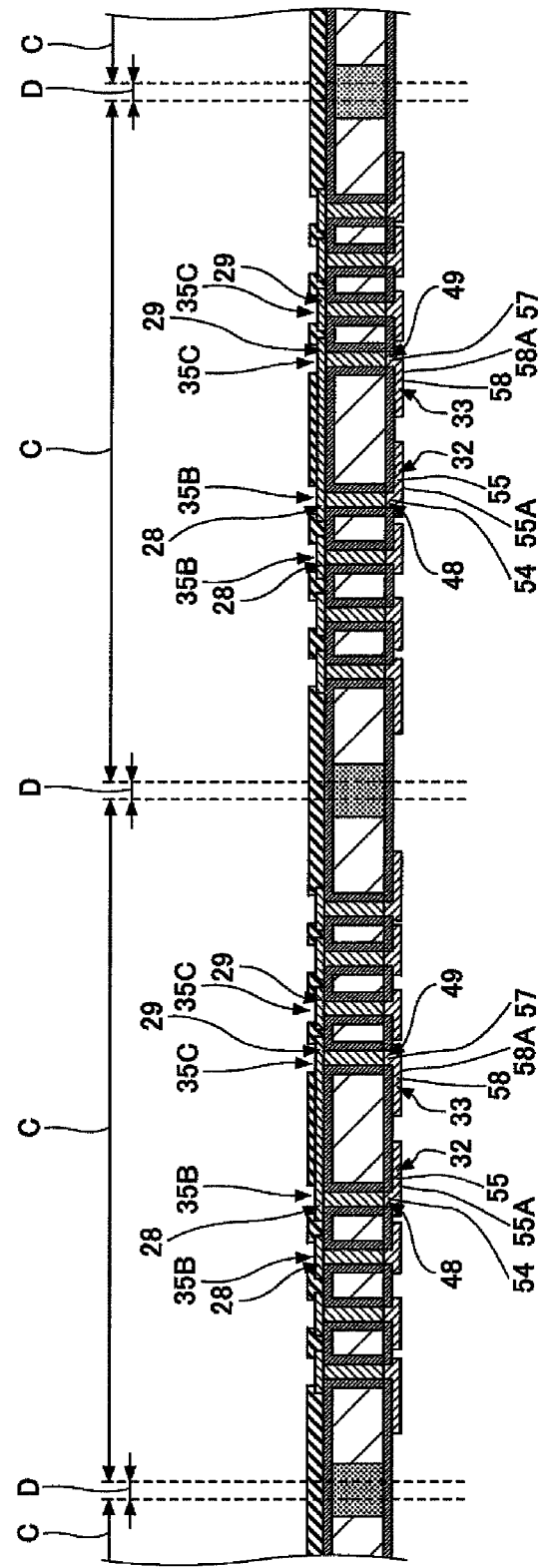
FIG. 18 is a schematic diagram illustrating a step of a method of manufacturing a semiconductor device according to the first embodiment of the present invention (part 14)

Then, in the step illustrated in FIG. 18, the second wiring patterns 32, 33 are simultaneously formed on predetermined parts of the lower surface 23A of the insulating film 23 (second wiring pattern forming step). The second wiring pattern 32 includes the via plug 54 and the external connection pad 55. The second wiring pattern 33 includes the via plug 57 and the external connection pad 58 areas on the lower side of the configuration illustrated in FIG. 18. Accordingly, the via plug 54 formed at the opening part 48 is connected to a lower end (lower end surface 25B) of the penetration electrode 25, and the via plug 57 formed at the opening part 49 is connected to a lower end (lower end surface 26B) of the penetration electrode 26.

More specifically, in one example, the second wiring patterns 32, 33 are formed by using a semi-additive method. For example, Cu may be used as the material of the second wiring patterns 32, 33.

Figure 19:
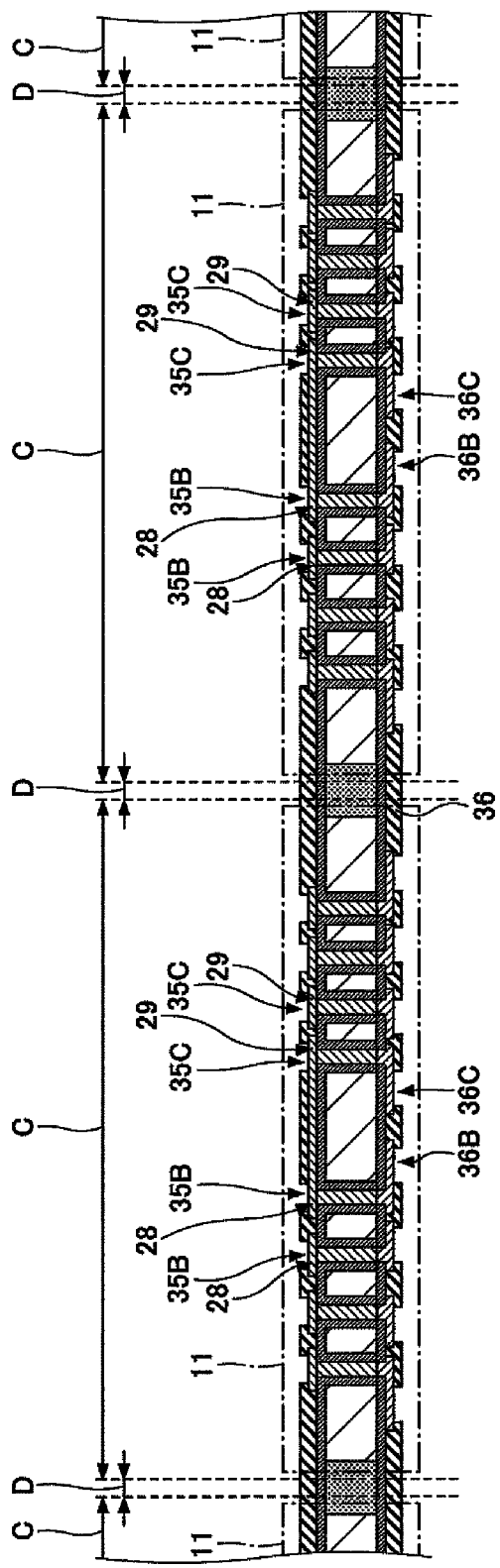
FIG. 19 is a schematic diagram illustrating a step of a method of manufacturing a semiconductor device according to the first embodiment of the present invention (part 15)

Then, in the step illustrated in FIG. 19, the second insulating resin layer 36 is formed on predetermined parts of the lower surface 23A of the insulating film 23 (second insulating resin layer forming step). The second insulating layer 36 includes the opening part 36B exposing the connection surface 55A of the external connection pad 55 and the opening part 36C exposing the connection surface 58A of the external connection pad 58. Accordingly, plural wiring substrates 11 can be formed in the plural wiring substrate forming regions.

Figure 20:
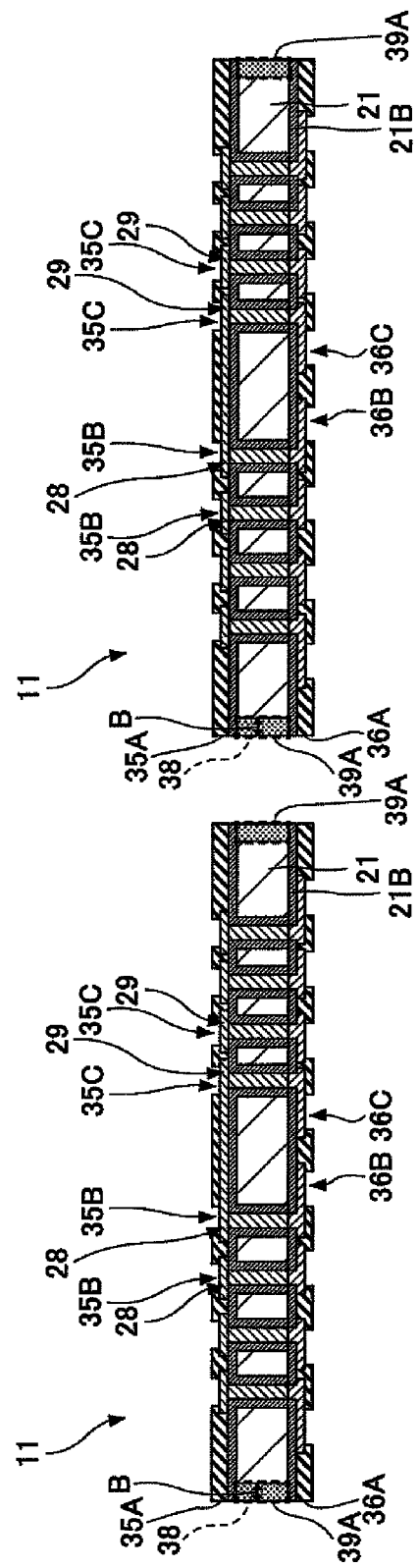
FIG. 20 is a schematic diagram illustrating a step of a method of manufacturing a semiconductor device according to the first embodiment of the present invention (part 16)

Then, in the step illustrated in FIG. 20, by cutting the substrate main body 65 along the cutting region D (that is, cutting the insulating films 22, 23, the first and second insulating resin layers 35, 36, and the resin material 39 provided at the area corresponding to the cutting region D), the substrate main body 65 is separated into plural wiring substrates 11 (cutting step). For example, a dicer may be used for cutting the substrate main body 65 at the cutting region D.

Accordingly, with the above-described embodiment, the resin material 39 can be formed in a manner covering the outer peripheral area of the fragile substrate, body 21 (which is one of the elements of the substrate body) by forming the groove 67 (having a greater width than that of the cutting region) in the wiring substrate regions (substrate formation areas) C and the cutting regions D, filling the groove 67 with the resin material 39, and cutting the substrate main body 65 into plural substrate bodies 21 by cutting the resin material 39 at the cutting regions D. Accordingly, the outer peripheral area of the substrate body 21 of the wiring substrate 11 can be prevented from being broken during handling (for example, the handling from completing the fabrication of the wiring substrate 11 to mounting the electronic components 12, 13 on the wiring substrate 11) of the wiring substrate 21.

Figure 21:
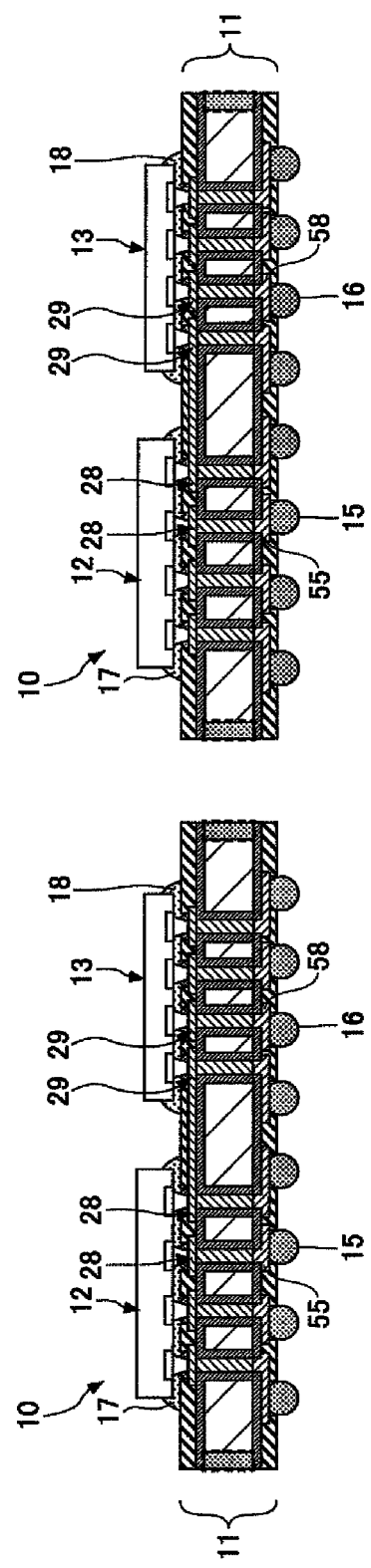
FIG. 21 is a schematic diagram illustrating a step of a method of manufacturing a semiconductor device according to the first embodiment of the present invention (part 17)

Then, in the step illustrated in FIG. 21, the electronic components 12, 13 are connected to the pads 51, 52 of the wiring substrate 11 by flip-chip bonding. Then, the space between the electronic component 12 and the wiring substrate 11 is filled with the underfill resin material 17, and the space between the electronic component 13 and the wiring substrate 11 is filled with the underfill resin material 18. Then, the external connection terminal 15 is mounted to the external connection pad 55, and the external connection terminal 16 is mounted to the external connection pad 58. Thereby, the semiconductor device 10 can be manufactured (fabricated) in the plural wiring substrate regions (substrate formation areas) C.

Therefore, with the above-described embodiment of manufacturing the wiring substrate 11, the resin material 39 can be formed in a manner covering the outer peripheral area of the fragile substrate body 21 (which is one of the elements of the substrate body) by forming the groove 67 (having a greater width than that of the cutting region) in the wiring substrate regions (substrate formation areas) C and the cutting regions D, filling the groove 67 with the resin material 39, and cutting the substrate main body 65 into plural substrate bodies 21 by cutting the resin material 39 at the cutting regions D. Accordingly, the outer peripheral area of the substrate body 21 of the wiring substrate 11 can be prevented from being broken during handling (for example, the handling from completing the fabrication of the wiring substrate 11 to mounting the electronic components 12, 13 on the wiring substrate 11) of the wiring substrate 21.

Figure 22:
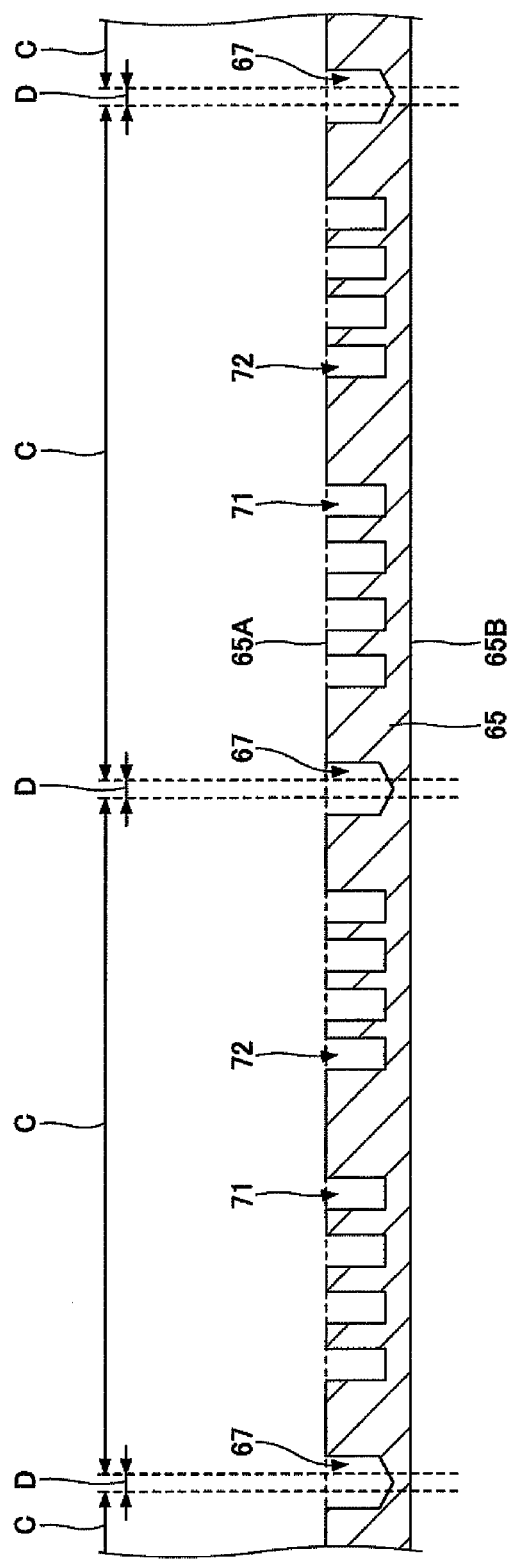
FIG. 22 is a schematic diagram illustrating a step of a another method of manufacturing a semiconductor device according to the first embodiment of the present invention (part 1)

Next, another method of manufacturing the semiconductor device 10 according to the first embodiment of the present invention is described with reference to FIGS. 22 and 23.

First, the substrate main body 65 described in FIG. 5 is prepared (preparation step). Then, in the step illustrated in FIG. 22, the groove 67 is formed in the cutting region D and in the plural wiring substrate regions C adjacent to the dicing region D (groove forming step). The groove 67 has a width greater than the width of the cutting region D. The groove 67 partly penetrates the substrate main body 65 from the upper surface 65A of the substrate main body 65. At the same time of forming the groove 67, plural opening parts 71, 72 are formed in the plural wiring substrate regions C. The plural opening parts 71, 72 partly penetrate the substrate main body 65 from the upper surface 65A of the substrate main body 65 (opening part forming step). In other words, the groove 67 and the opening parts 71, 72 are formed simultaneously.

By forming the groove 67 and the opening parts 71, 72 simultaneously, the number of steps for manufacturing the wiring substrate 11 can be reduced. Thereby, the manufacturing cost of the wiring substrate 11 can be reduced.

Figure 23:
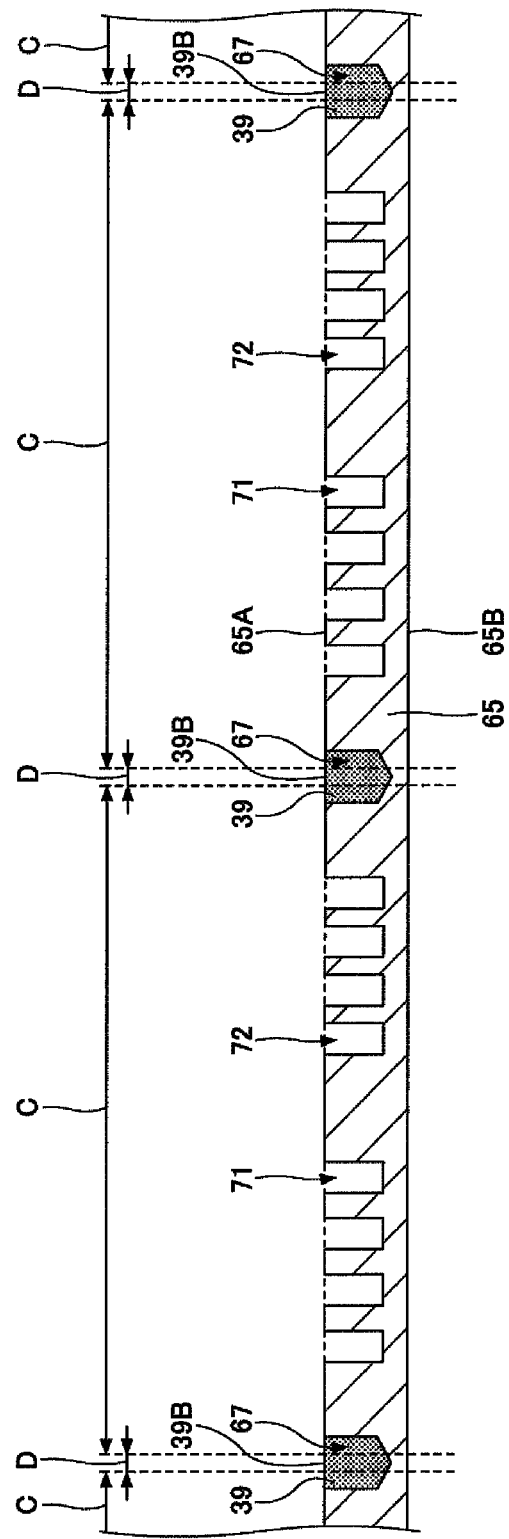
FIG. 23 is a schematic diagram illustrating a step of another method of manufacturing a semiconductor device according to the first embodiment of the present invention (part 2)

Then, in the step illustrated in FIG. 23, by performing the steps described above in FIGS. 7-9, the resin material 39 can be formed having its upper surface 39B substantially flush with the upper surface 65A of the substrate main body 65 at the groove 67. Then, by performing the steps described above in FIGS. 11-21, plural semiconductor devices 10 of the first embodiment can be manufactured.

Therefore, with the above-described other method of manufacturing the wiring substrate 11 according to the first embodiment, the number of steps for manufacturing the wiring substrate 11 can be reduced by forming the groove 67 and the opening parts 71, 72 simultaneously. Thereby, the manufacturing cost of the wiring substrate 11 can be reduced.

Second Embodiment

Figure 24:
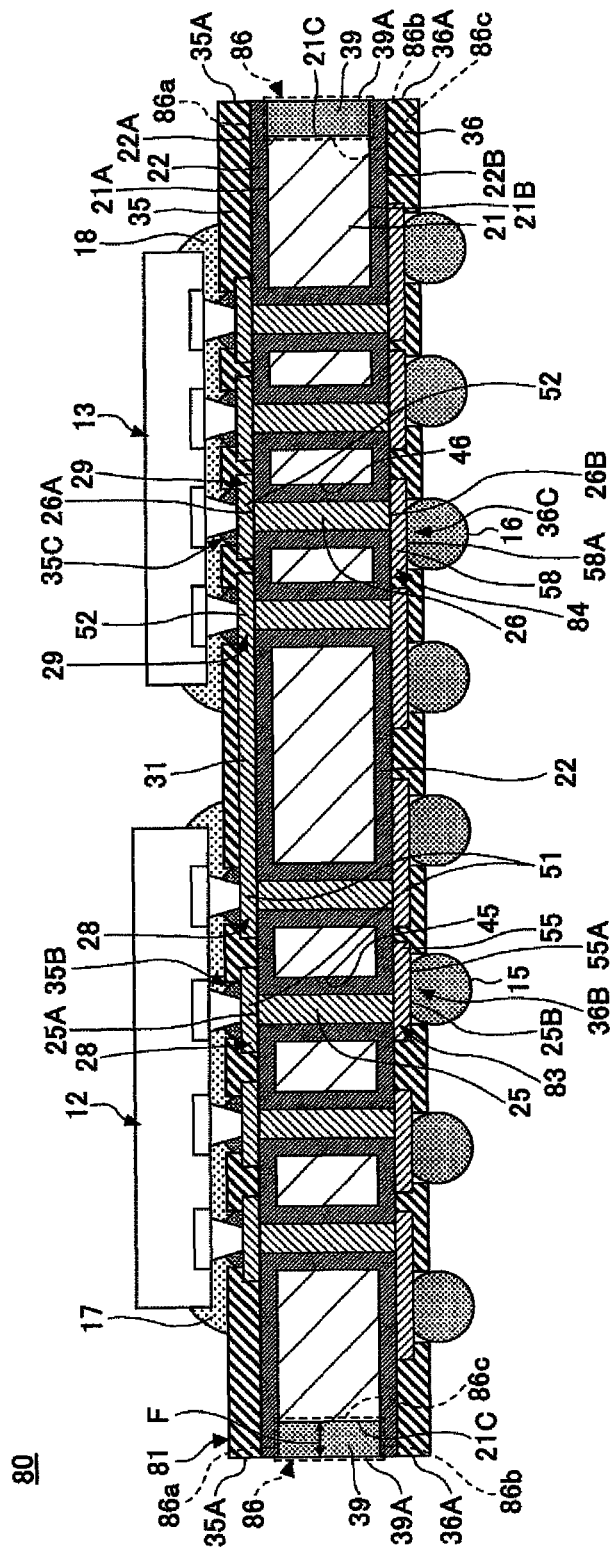
FIG. 24 is a cross-sectional diagram illustrating a semiconductor device according to a second embodiment of the present invention.

FIG. 24 is a cross-sectional diagram illustrating a semiconductor device 80 according to a second embodiment of the present invention. In the second embodiment, like components are denoted with like reference numerals of the first embodiment and are not further described.

With reference to FIG. 24, the semiconductor device 80 according to the second embodiment has substantially the same configuration as the semiconductor device 10 of the first embodiment except that the semiconductor device 80 includes the below-described wiring substrate 81 instead of the wiring substrate 11.

In the second embodiment, the wiring substrate 81 includes second wiring patterns 83, 84 and plural notch parts 86 instead of using the above-described wiring substrate 11 including the second wiring patterns 32, 33 and the notch part 38. Further, the wiring substrate 81 includes no component corresponding to the insulating film 23 of the wiring substrate 11. Further, in this embodiment, the insulating film 22 is formed in a manner covering the lower surface 21B of the substrate body 21. The wiring substrate 81 has a square shape from a plan view thereof.

The second wiring pattern 83 is provided on the lower surface 22B of the insulating film 22 formed below the lower surface 21B of the substrate body 21. The second wiring pattern 83 is connected to a lower end (end surface 25B) of the penetration electrode 25. Further, the second wiring pattern 83 includes the external connection pad 55 having the connection surface 55A. For example, Cu may be used as the material of the second wiring pattern 83.

The second wiring pattern 84 is provided on the lower surface 22B of the insulating film 22 formed below the lower surface 21B of the substrate body 21. The second wiring pattern 84 is connected to a lower end (end surface 25B) of the penetration electrode 25. Further, the second wiring pattern 84 includes the external connection pad 55 having the connection surface 55A. For example, Cu may be used as the material of the second wiring pattern 84.

Figure 25:
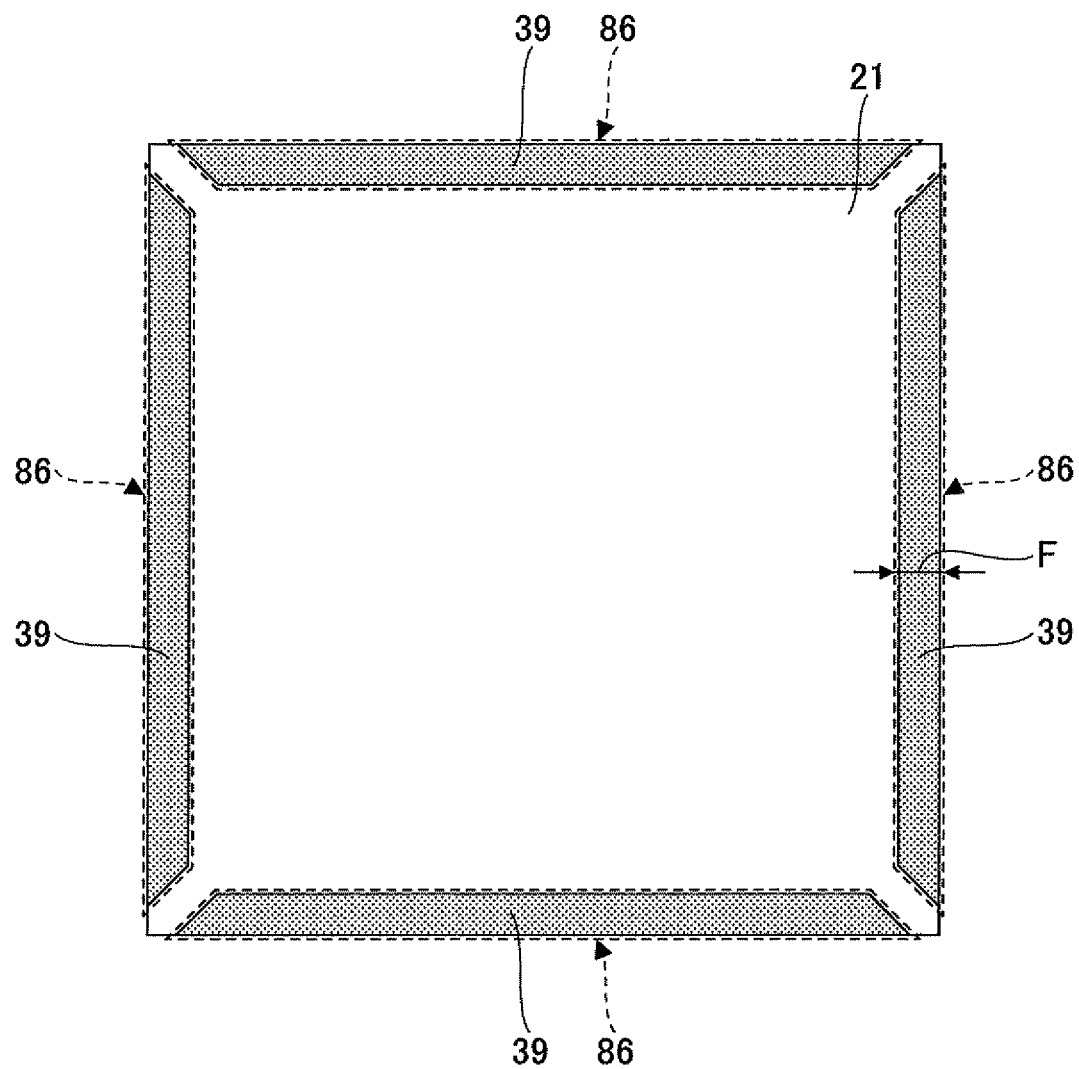
FIG. 25 is a schematic diagram for describing a notch part illustrated in FIG. 24.

FIG. 25 is a schematic diagram for describing the notch part 86 illustrated in FIG. 24. It is to be noted that FIG. 25 illustrates a plan view of only the notch parts 86 containing the resin material 39 and the wiring substrate 81 for the sake of describing the shape of the notch part 86. In FIG. 25, like components are denoted with like reference numerals of the semiconductor device 80 of FIG. 24.

With reference to FIGS. 24 and 25, plural notch parts 86 are formed in an outer peripheral area of the substrate body 21 (in this embodiment, four notch parts 86 are formed). In this embodiment, although the notch parts 86 are arranged adjacent to each other, the notch parts 86 are not connected to each other. In other words, the notch parts 86 are independent from each other.

In this embodiment, one of the notch parts 86 is a recess defined by first-third inner surfaces 86*a*, 86*b*, and 86*c*. The first and second inner surfaces 86*a*, 86*b* are positioned facing each other in a vertical direction (i.e. thickness direction of the wiring substrate 81) and are connected via the third inner surface 86*c*. The third inner surface 86*c* is substantially in plane with the outer peripheral surface 21C of the substrate body 21 provided more inward than the outer peripheral side surfaces 35A, 36A of the first and second insulating resin layers 35, 36. The notch part 86 can be formed having a width of, for example, 100 μm.

The resin material 39 is provided in the notch part 86 in a manner covering the outer peripheral surface 21C of the substrate body 21. The resin material 39 is formed having substantially the same shape as the notch part 86.

Accordingly, the outer peripheral area of the fragile substrate body 21 can be protected by the resin material 39 by forming plural notch parts 86 formed by arranging the outer peripheral side surface 21C of the substrate body 21 at a position more inward than a position of the outer peripheral side surfaces 35A, 36A of the first and second insulating resin layers 35, 36 and providing the resin material 39 in the notch parts 86 in a manner covering the outer peripheral side surface 21C of the substrate body 21. Thereby, the outer peripheral area of the substrate body 21 can be prevented from being damaged (broken) during handling of the wiring substrate 81.

Further, it is preferable to arrange the outer peripheral side surface 39A of the resin material 39 in a manner substantially flush with the outer peripheral side surfaces 35A, 36A of the first and second insulating resin layers 35, 36. Further, it is preferable to arrange the outer peripheral side surface 39A of the resin material more inward than the outer side surfaces 35A, 36A of the first and second insulating resin layers 35, 36. Thus, by arranging the outer peripheral side surface 39A of the resin material 39 in a manner substantially flush with the outer peripheral side surfaces 35A, 36A of the first and second insulating resin layers 35, 36 and/or by arranging the outer peripheral side surface 39A of the resin material more inward than the outer peripheral side surfaces 35A, 36A of the first and second insulating resin layers 35, 36, the outer peripheral area of the substrate body 21 can be prevented from being broken without having to significantly increase the size of the substrate body 11 in the plane direction.

For example, epoxy resin, polyimide resin, or silicone resin may be used as the resin material 39.

With the wiring substrate 81 of the above-described embodiment, the outer peripheral area of the fragile substrate body 21 can be protected by the resin material 39 by forming plural notch parts 86 formed by arranging the outer peripheral side surface 21C of the substrate body 21 at a position more inward than a position of the outer peripheral side surfaces 35A, 36A of the first and second insulating resin layers 35, 36 and providing the resin material 39 in the notch parts 86 in a manner covering the outer peripheral side surface 21C of the substrate body 21. Thereby, the outer peripheral area of the substrate body 21 can be prevented from being damaged (broken) during handling of the wiring substrate 81.

The processes of manufacturing the semiconductor device 80 according to an embodiment of the present invention are described with reference to FIGS. 26-40. FIG. 40 is a plan view of the substrate main body 65 illustrated in FIG. 27. In FIGS. 26-39, like parts and components are denoted by like reference numerals as of the above-described second embodiment of the semiconductor device 80.

Figure 26:
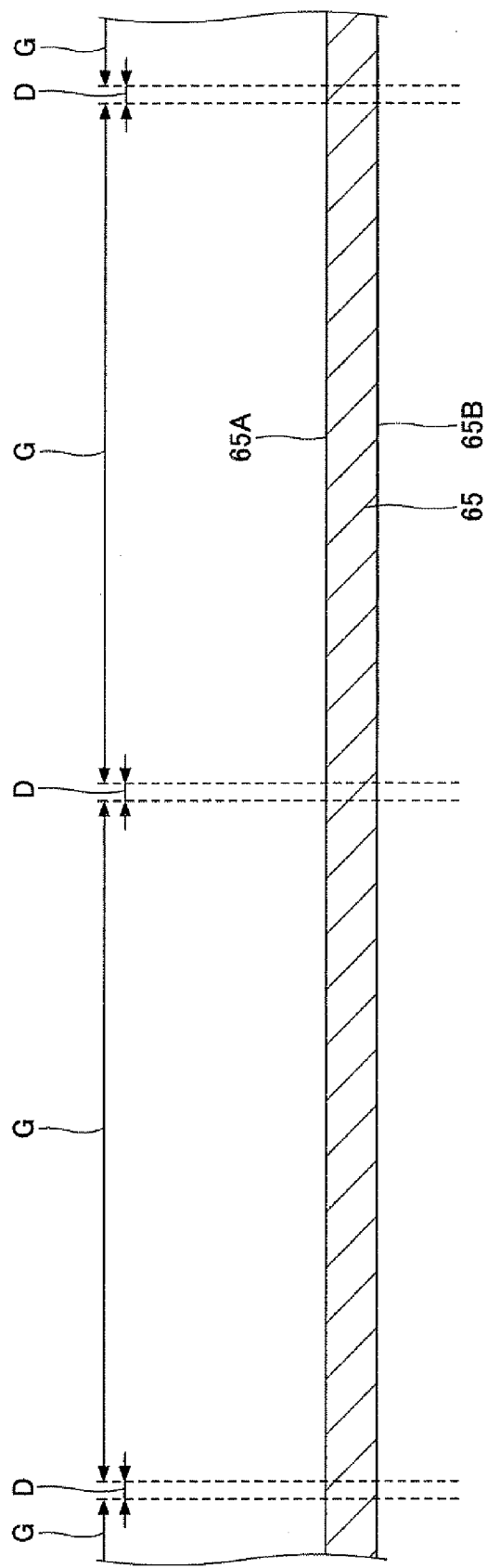
FIG. 26 is a schematic diagram illustrating a step of a method of manufacturing a semiconductor device according to the second embodiment of the present invention (part 1)

First, in the step illustrated in FIG. 26, a substrate main body 65 is prepared (preparation step). The substrate main body 65 includes plural wiring substrate regions (substrate forming areas) G and dicing regions (cutting areas) D arranged in a manner encompassing the plural wiring substrate regions G. The wiring substrates 81 are to be formed in the wiring substrate regions G.

As described above in the first embodiment, the substrate main body 65 of FIG. 26 is formed into a thin shape by performing a thickness reducing (thinning) process on the above-described substrate main body 65 illustrated in FIG. 5. In one example, the thickness of the substrate main body 65 is reduced by performing a polishing process, a grinding process, or both process on the substrate main body 65. The thickness of the substrate main body 65 is, for example, 200 μm.

Figure 27:
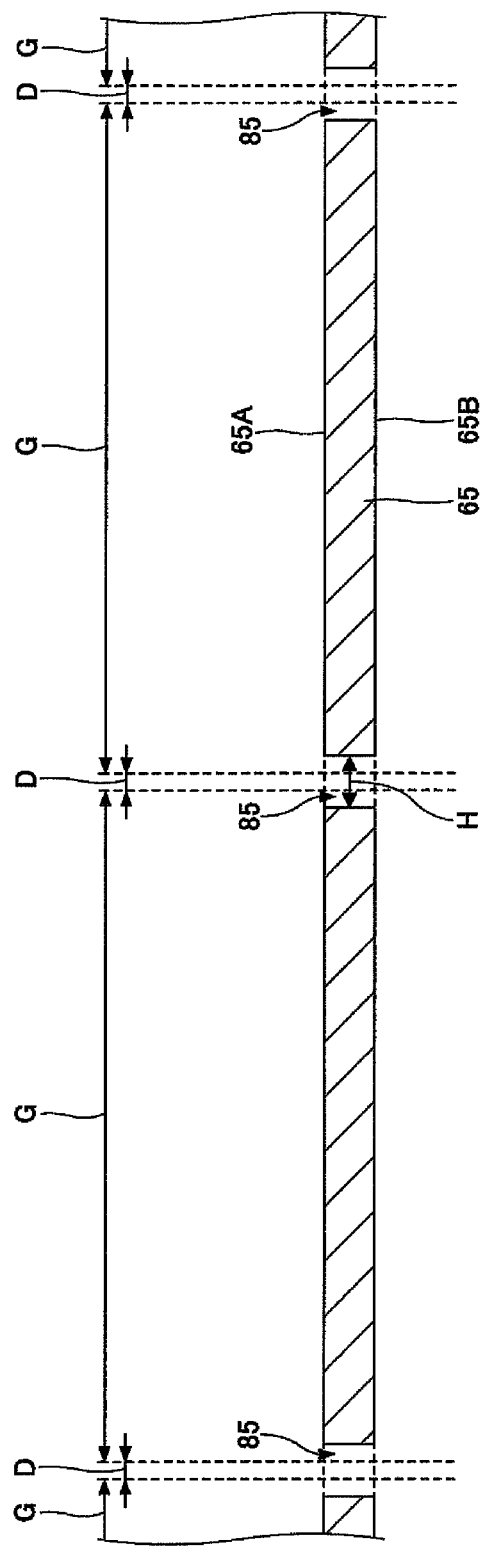
FIG. 27 is a schematic diagram illustrating a step of a method of manufacturing a semiconductor device according to the second embodiment of the present invention (part 2)

Then, in the step illustrated in FIG. 27, plural penetration grooves 85 are formed in the cutting region D and in the plural wiring substrate regions G adjacent to the dicing region D (penetration groove forming step). The penetration groove 85 has a width greater than the width of the cutting region D. The penetration groove 85 penetrates through the substrate main body 65 from the upper surface 65A of the substrate main body 65 to the lower surface 65B of the substrate main body 65. For example, the penetration groove 85 may be formed by dicing a corresponding part of the substrate main body 65. In this embodiment where the width of the cutting region D is 50 μm and the thickness of the resin material 39 of the wiring substrate 81 is 200 μm, the width H of the penetration groove 85 is, for example, 250 μm.

After the thickness reduction step, the substrate body 65 is subjected to the below-described cutting process of FIG. 38 (cutting step). By cutting the substrate main body 65, the notch part 86 (see, for example, FIG. 24) is obtained. The obtained notch part 86 is one of the elements of the wiring substrate 81 according to an embodiment of the present invention.

Figure 28:
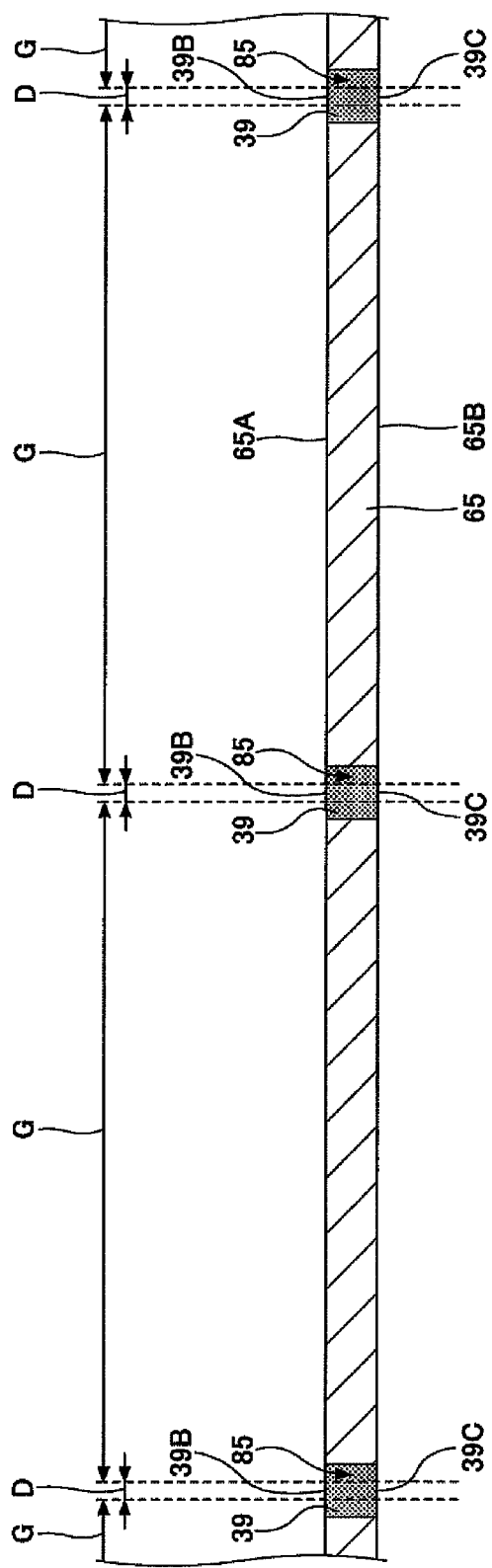
FIG. 28 is a schematic diagram illustrating a step of a method of manufacturing a semiconductor device according to the second embodiment of the present invention (part 3)

Then, in the step illustrated in FIG. 28, by performing the steps illustrated in FIGS. 7-9 (resin filling step and resin removing step) in the same manner described in the first embodiment, the resin material 39 is formed in a manner penetrating through the substrate main body 65. In this step, the upper surface 39B of the resin material 39 is to be substantially flush with the upper surface 65A of the substrate main body 65, and the lower surface 39C of the resin material 39 is to be substantially flush with the lower surface 65B of the substrate main body 65. For example, epoxy resin, polyimide resin, or silicone resin may be used as the resin material 39.

Figure 29:
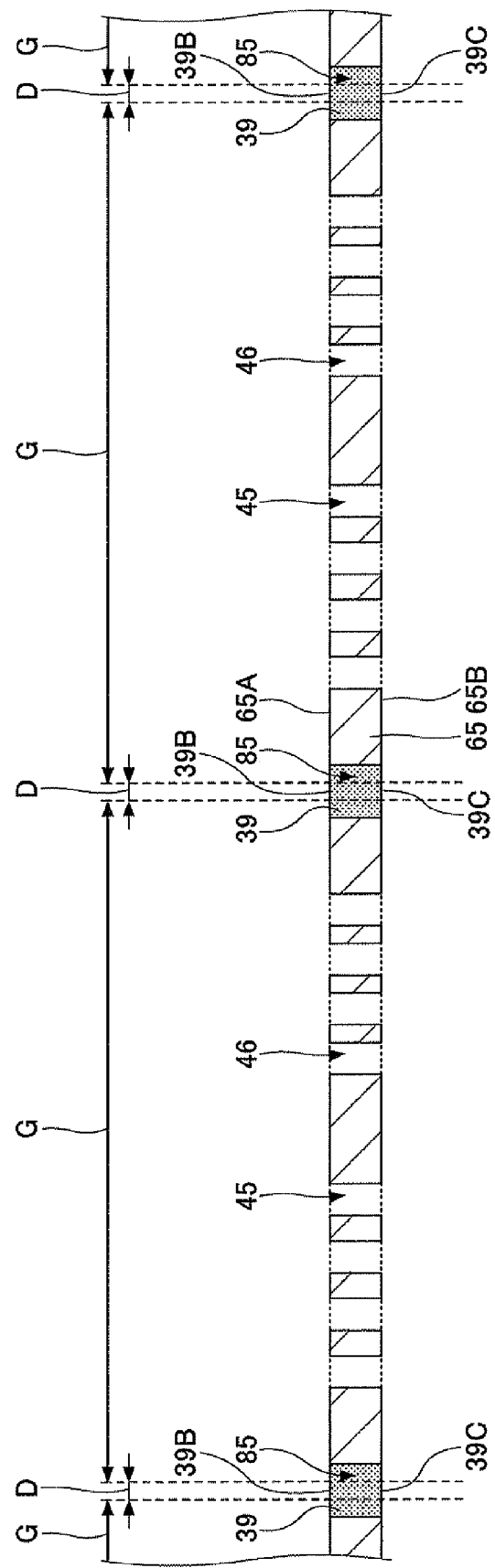
FIG. 29 is a schematic diagram illustrating a step of a method of manufacturing a semiconductor device according to the second embodiment of the present invention (part 4)
Figure 30:
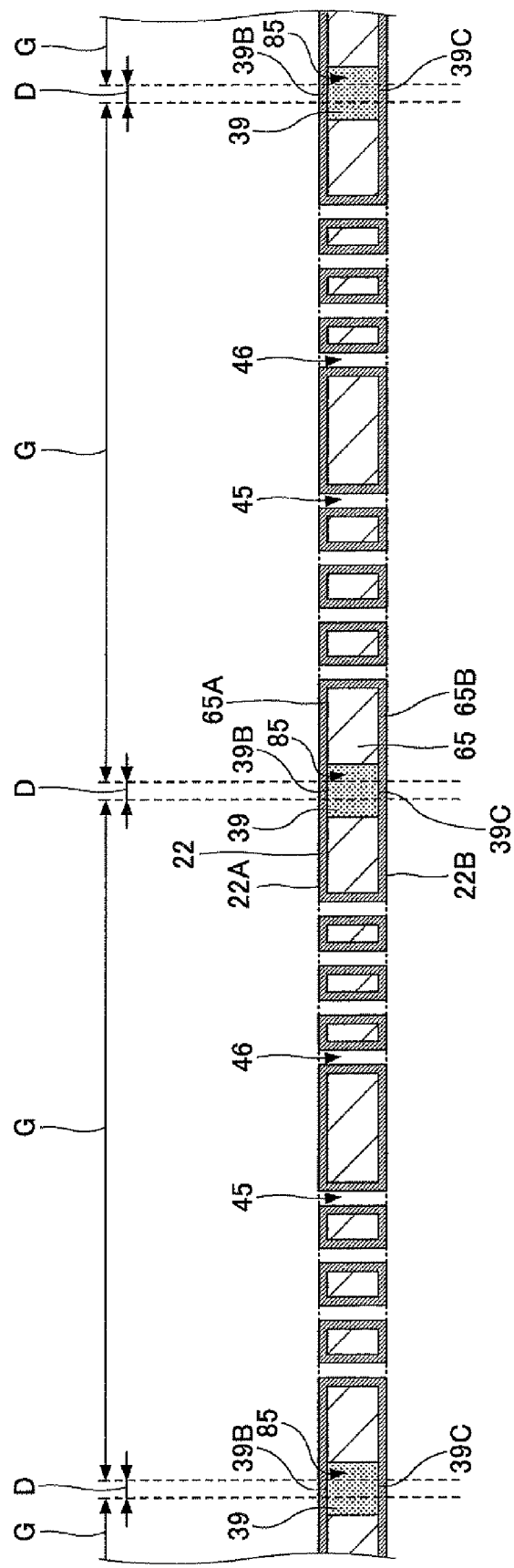
FIG. 30 is a schematic diagram illustrating a step of a method of manufacturing a semiconductor device according to the second embodiment of the present invention (part 5)

Then, in the step illustrated in FIG. 29, plural through-holes 45, 46 are formed on the upper surface 65A of the substrate main body 65 (through-hole forming step). The through-holes 45, 46 are formed in the plural wiring substrate regions G. The through-holes 45, 46 penetrate the substrate main body 65 from the upper surface 65A of the substrate main body 65 to the lower surface 65B of the substrate main body 65 (opening part forming step). More specifically, in one example, the through-holes 45, 46 are formed by performing an anisotropic etching process (e.g., dry etching) on parts of the substrate main body 65 in the plural wiring substrate regions G.

Then, the insulating film 22 is formed in a manner covering the surface of the substrate main body 65 (including the upper and lower surfaces 65A, 65B of the substrate main body 65 and side surfaces of the substrate main body that form the through-holes 45, 46) and the upper and lower surfaces 39B, 39C of the resin material 39.

The insulating film 22 may be, for example, an oxide film formed by a CVD, method. More specifically, in one example, $SiO_2$ may be used as the insulating film 22. In this example, the thickness of the insulating film 22 is 1 μm.

Figure 31:
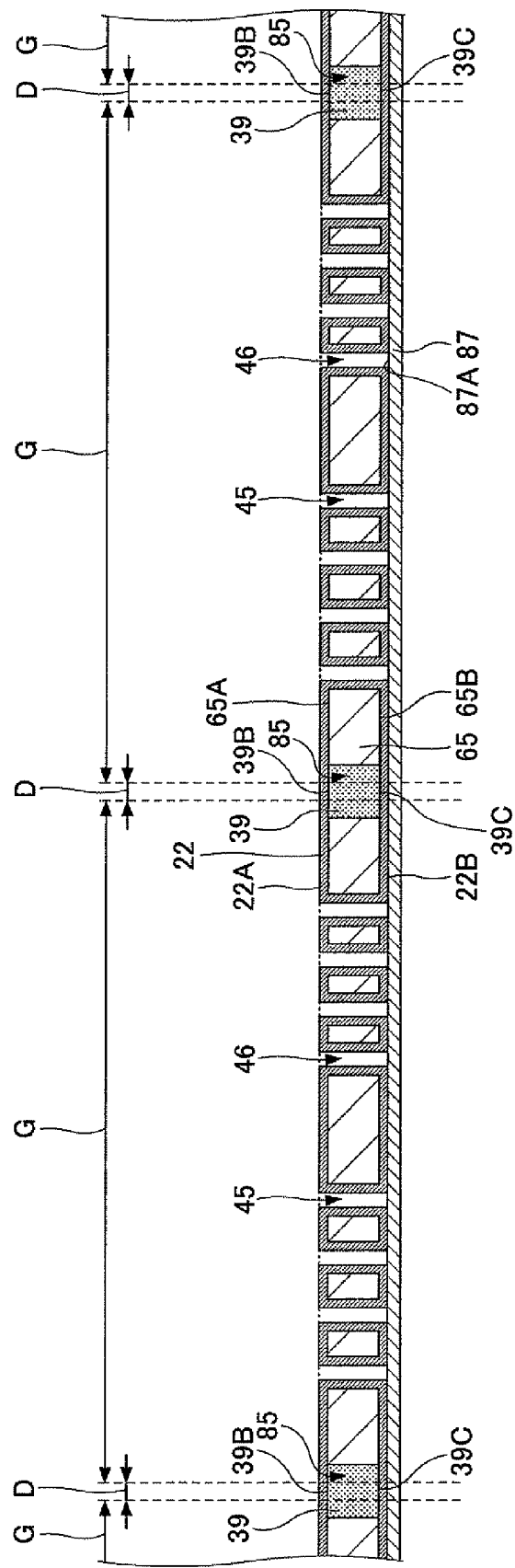
FIG. 31 is a schematic diagram illustrating a step of a method of manufacturing a semiconductor device according to the second embodiment of the present invention (part 6)

Then, a metal plate 87 is adhered to the lower surface 22B of the insulating film 22 as illustrated in FIG. 31. For example, a Cu plate may be used as the metal plate 87. Alternatively, a metal foil (e.g., Cu foil) may be used instead of the metal plate 87.

Figure 32:
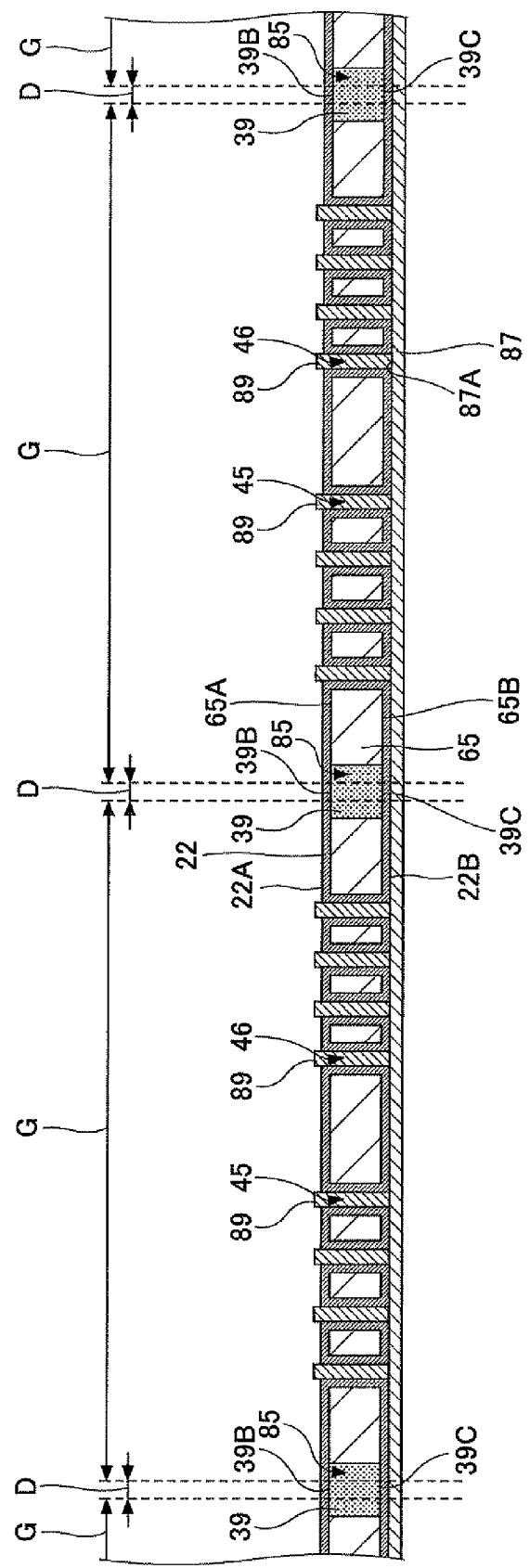
FIG. 32 is a schematic diagram illustrating a step of a method of manufacturing a semiconductor device according to the second embodiment of the present invention (part 7)

Then, in the step illustrated in FIG. 32, the through-holes 45, 46 are filled with conductive material 89 (in this example, Cu plating film is used) by performing an electrolytic plating method that uses the metal plate 87 as a power feeding layer. Although an electroplating method is used for forming the conductive material 89, the conductive material 89 may be formed by performing a printing method that fills the through-holes 45, 46 with a conductive paste (e.g., Cu paste, Ag paste, or Ni paste). As illustrated in FIG. 32, in some cases, the conductive material 89 projects from the upper surface 22A of the insulating film 22.

Figure 33:
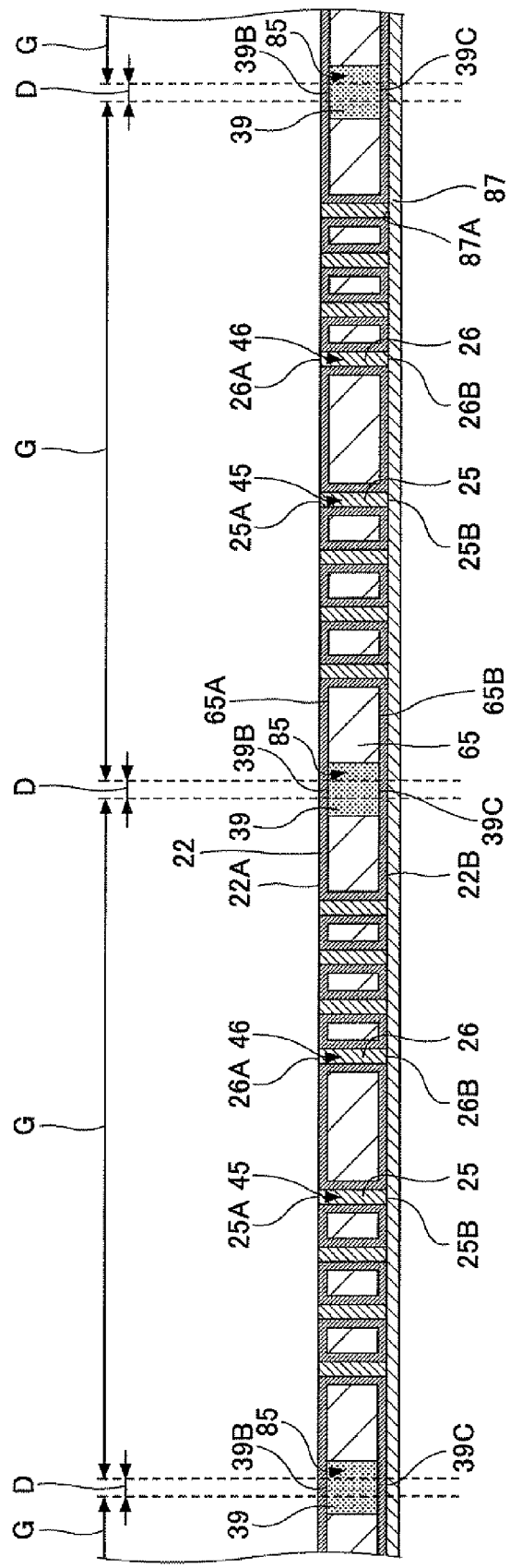
FIG. 33 is a schematic diagram illustrating a step of a method of manufacturing a semiconductor device according to the second embodiment of the present invention (part 8)

Then, in the step illustrated in FIG. 33, the conductive material 89 projecting from the upper surface 22A of the insulating film 22 is removed (conductive material removing step). In one example, by performing a polishing process using a polishing liquid, only the conductive material 89 projecting from the upper surface 22A of the insulating film 22 can be removed.

Thereby, the penetration electrode 25 containing the conductive material 89 is formed in the through-hole 45, and the penetration electrode 26 containing the conductive material 89 is formed in the through-hole 46. In the above-described conductive material removing step, the part of the conductive material 89 projecting from the upper surface 22A of the insulating film 22 is removed so that the upper end surfaces 25A, 26A of the penetration electrodes 25, 26 become flush with the upper surface 22A of the insulating film 22. In this embodiment, the steps illustrated in FIGS. 31-33 correspond to the penetration electrode forming step.

Figure 34:
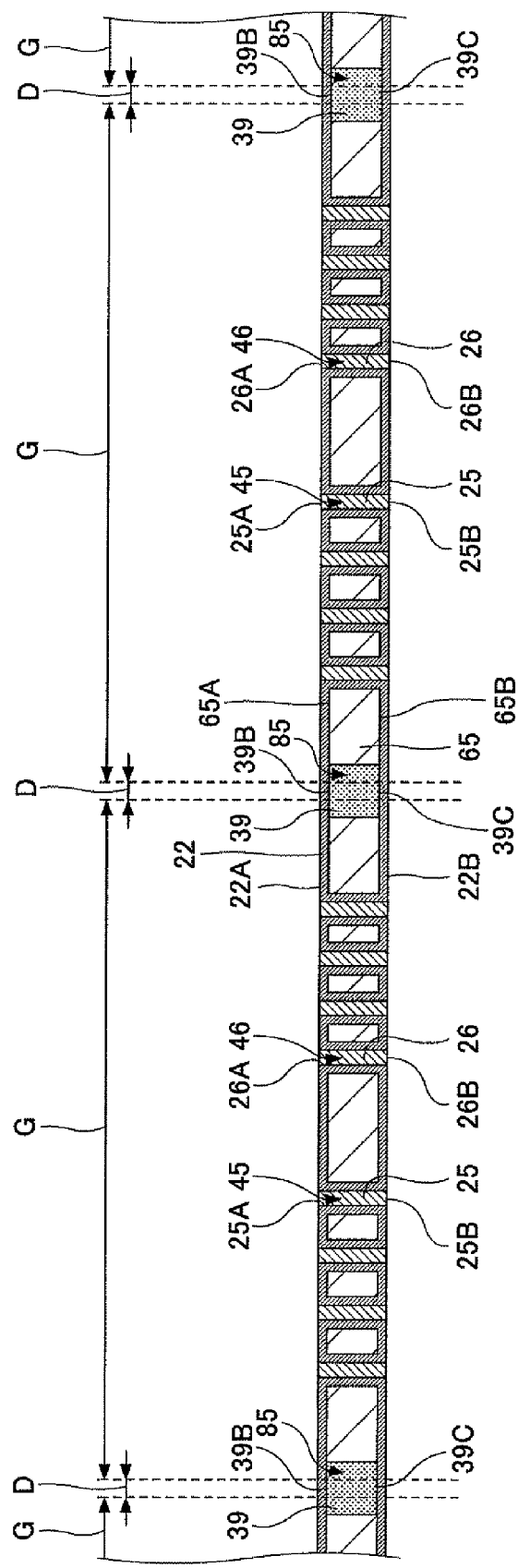
FIG. 34 is a schematic diagram illustrating a step of a method of manufacturing a semiconductor device according to the second embodiment of the present invention (part 9)

Then, in the step illustrated in FIG. 34, the metal plate 87 illustrated in FIG. 33 is removed. For example, in a case where the metal plate 34 is a Cu plate, the metal plate 87 is removed by using a wet-etching method.

Figure 35:
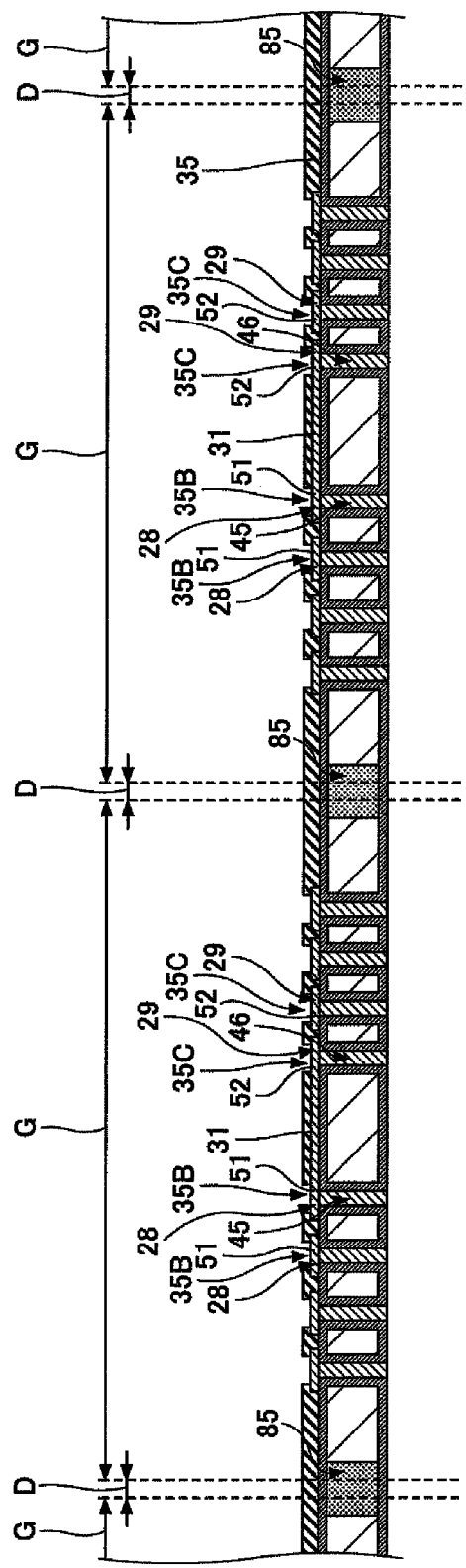
FIG. 35 is a schematic diagram illustrating a step of a method of manufacturing a semiconductor device according to the second embodiment of the present invention (part 10)

Then, in the step illustrated in FIG. 35, the above-described steps (first wiring pattern forming step and first insulating resin forming step) illustrated in FIGS. 16 and 17 of the first embodiment are performed. Thereby, the first wiring patterns 28, 29, the wiring 31, and the first insulating resin layer 35 are formed on predetermined parts of the upper surface (including the upper surface 22A of the insulating film 22, the upper end surfaces 25A, 26A of the penetration electrodes 25, 26) of the configuration illustrated in FIG. 34. For example, Cu may be used as the material of the first wiring patterns 28, 29 and the wiring 31. Further, a solder resist layer may be used as the first insulating resin layer 35.

Figure 36:
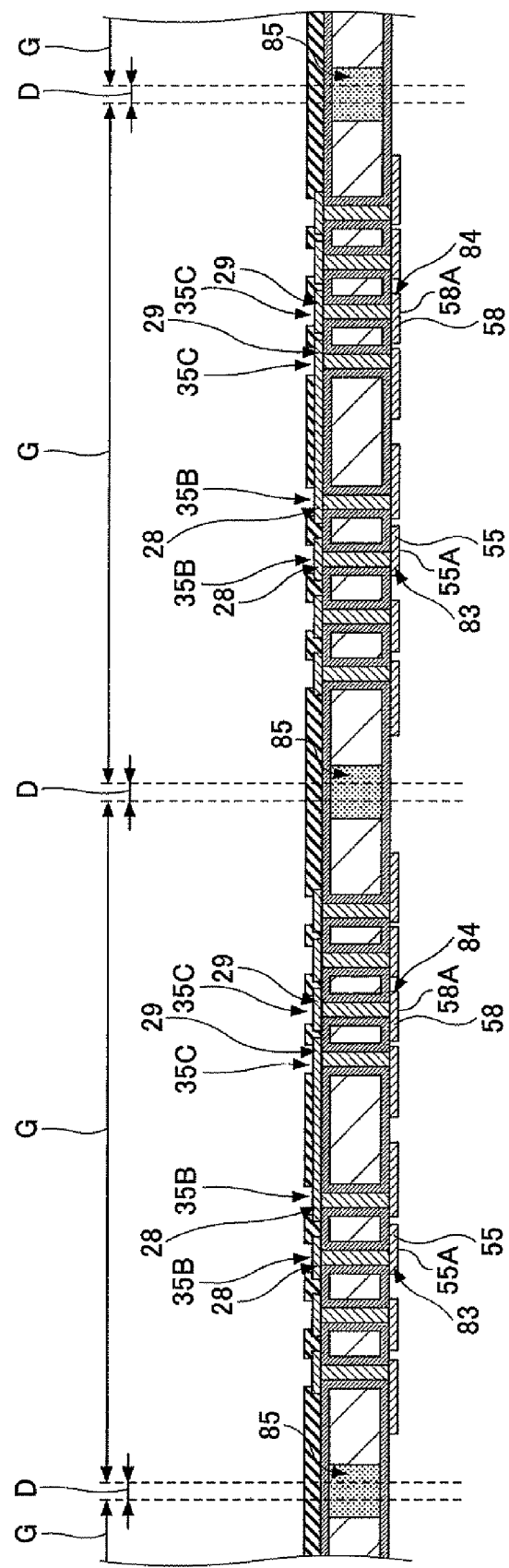
FIG. 36 is a schematic diagram illustrating a step of a method of manufacturing a semiconductor device according to the second embodiment of the present invention (part 11)

Then, in the step illustrated in FIG. 36, the second wiring pattern 83 including the external connection pad 55 and the second wiring pattern 84 including the external connection pad 58 are simultaneously formed on predetermined parts of the lower surface (including the lower surface 22B of the insulating film 22, the lower end surfaces 25B, 26B of the penetration electrodes 25, 26 as illustrated in FIG. 34) of the configuration illustrated in FIG. 35 (second wiring pattern forming step).

In one example, the second wiring patterns 83, 84 may be formed with a semi-additive method. Further, Cu may be used as the material of the second wiring patterns 83, 84.

Figure 37:
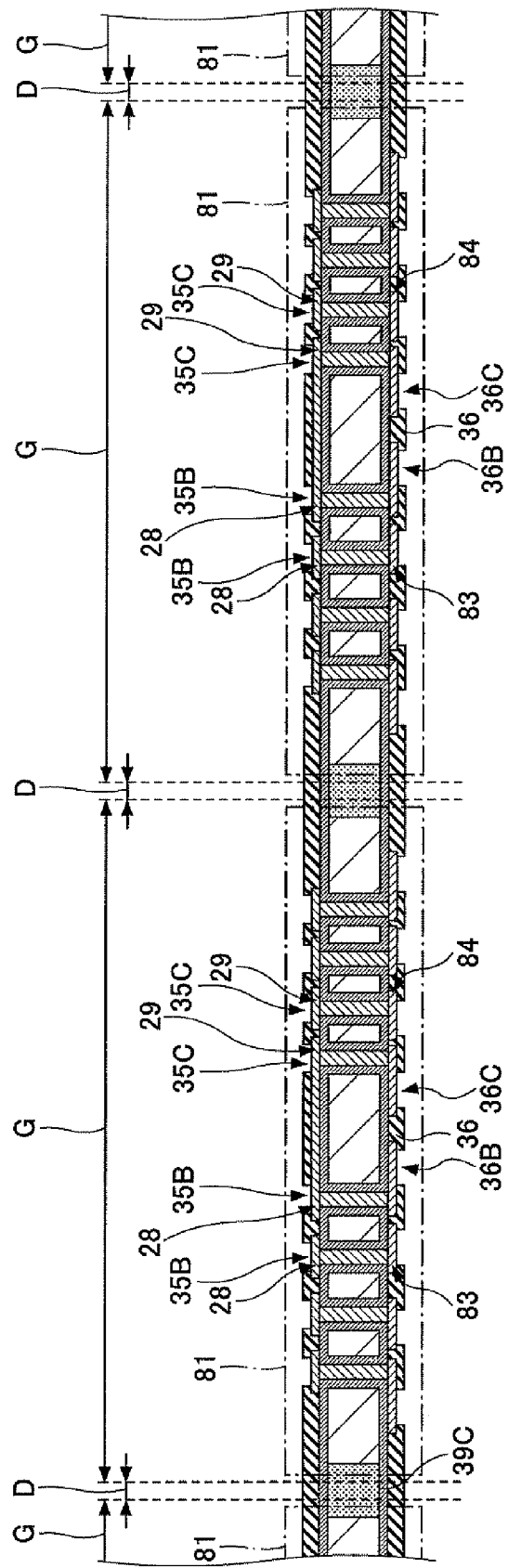
FIG. 37 is a schematic diagram illustrating a step of a method of manufacturing a semiconductor device according to the second embodiment of the present invention (part 12)

Then, in the step illustrated in FIG. 37, the second insulating resin layer 36 is formed on predetermined parts of the lower surface 22B of the insulating film 22 (second insulating resin layer forming step). The second insulating resin layer 36 includes the opening part 36B exposing the connection surface 55A of the outer connection pad 55 and the opening part 36C exposing the connection surface 58A of the external connection pad 58. Thereby, the wiring substrate 81 can be formed in the plural wiring substrate regions G.

Figure 38:
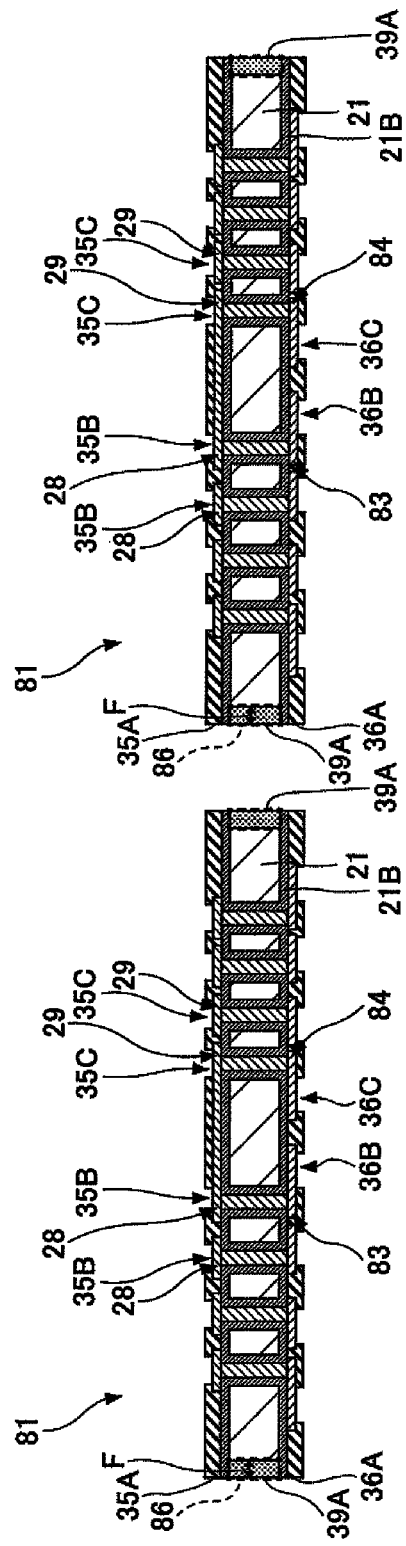
FIG. 38 is a schematic diagram illustrating a step of a method of manufacturing a semiconductor device according to the second embodiment of the present invention (part 13)

Then, in the step illustrated in FIG. 38, by cutting the substrate main body 65 along the cutting region D (that is, cutting the insulating films 22, the first and second insulating resin layers 35, 36, and the resin material 39 provided at the area corresponding to the cutting region D), the substrate main body 65 is separated into plural wiring substrates 81 (cutting step). The parts of the main body 65 which partition the grooves 85 are also cut in the cutting step as illustrated in FIG. 40. For example, a dicer may be used for cutting the substrate main body 65 at the cutting region D.

Accordingly, the resin material 39 can be formed in a manner covering the outer peripheral area of the fragile substrate body 21 (which is one of the elements of the substrate body) by forming the plural penetration grooves 85 (having a greater width than that of the cutting region D and penetrating through the substrate main body 65) in the wiring substrate regions G and the cutting regions D, filling the penetration grooves 85 with the resin material 39, and cutting the substrate main body 65 into plural substrate bodies 21 by cutting the resin material 39 at the cutting regions D. Accordingly, the outer peripheral area of the substrate body 21 of the wiring substrate 81 can be prevented from being broken during handling (for example, the handling from completing the fabrication of the wiring substrate 81 to mounting the electronic components 12, 13 on the wiring substrate 81) of the wiring substrate 81.

Figure 39:
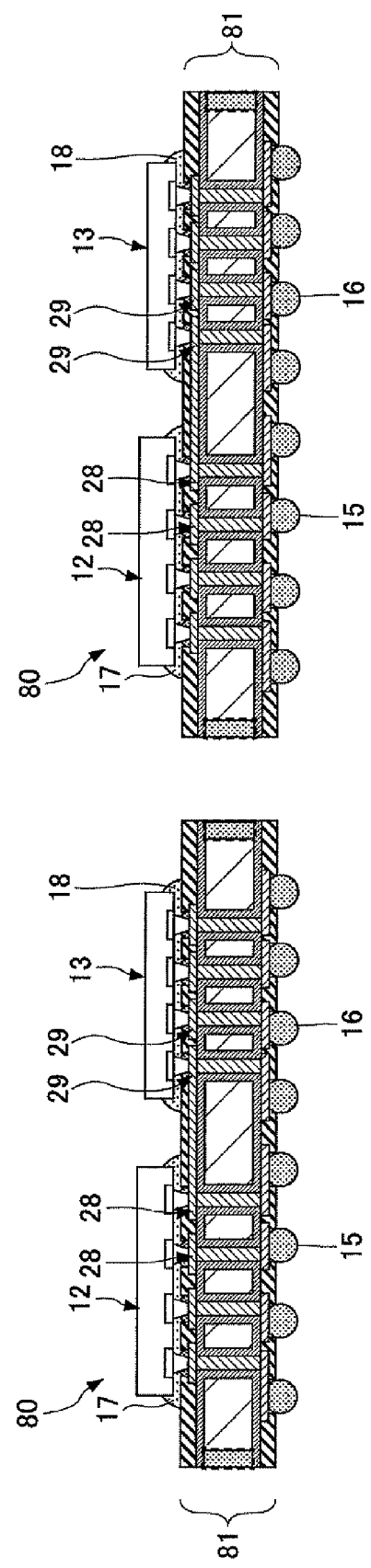
FIG. 39 is a schematic diagram illustrating a step of a method of manufacturing a semiconductor device according to the second embodiment of the present invention (part 14)
Figure 40:
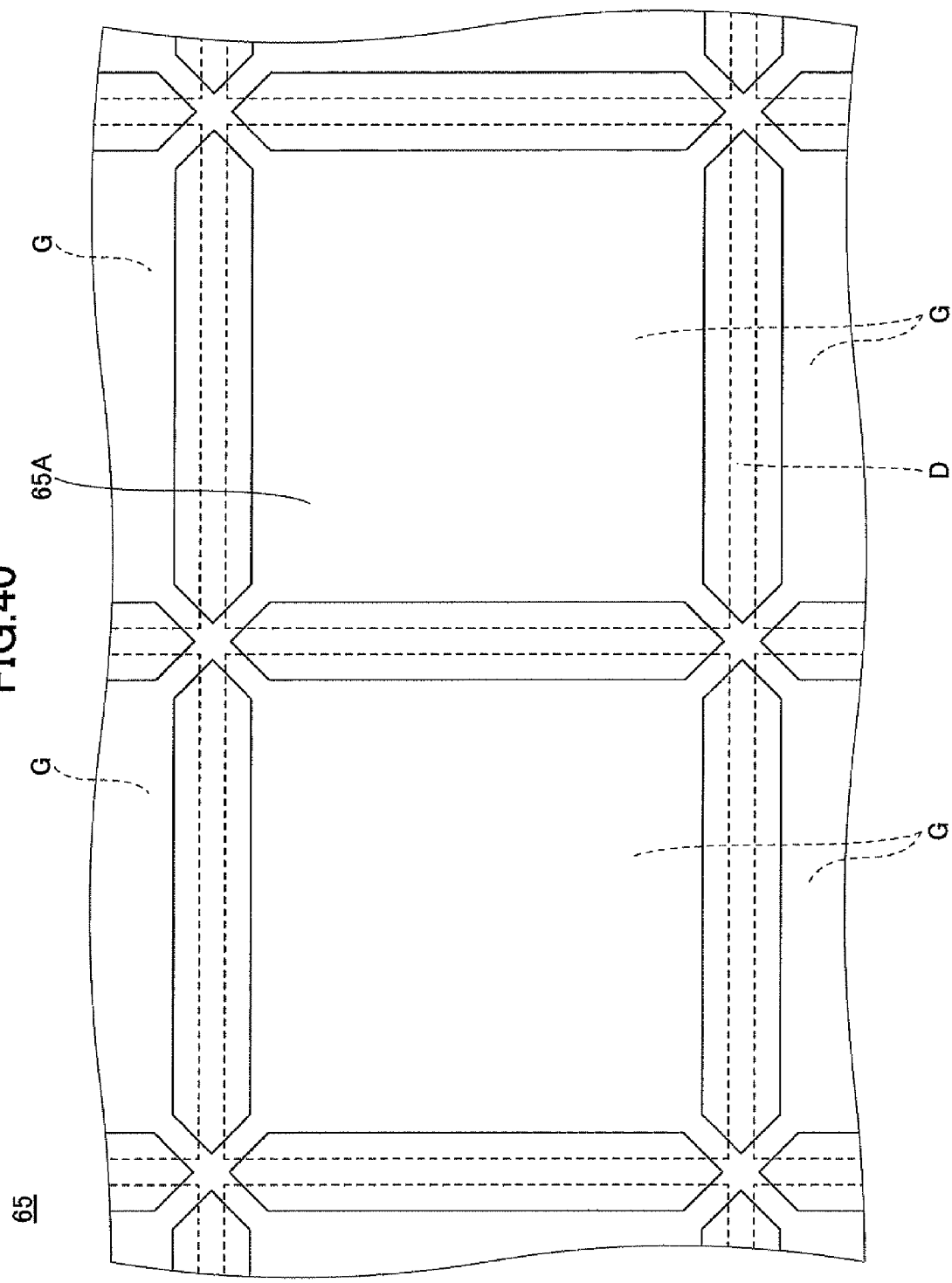
FIG. 40 is a plan view of a substrate main body 65 illustrated in FIG. 27.

Then, in the step illustrated in FIG. 39, the electronic components 12, 13 are connected to the pads 51, 52 of the wiring substrate 81 by flip-chip bonding. Then, the space between the electronic component 12 and the wiring substrate 81 is filled with the underfill resin material 17, and the space between the electronic component 13 and the wiring substrate 81 is filled with the underfill resin material 18. Then, the external connection terminal 15 is mounted to the external connection pad 55, and the external connection terminal 16 is mounted to the external connection pad 58. Thereby, the semiconductor device 80 can be manufactured (fabricated) in the plural wiring substrate regions (substrate formation areas) G.

Therefore, with the above-described embodiment of manufacturing the wiring substrate 81, the resin material 39 can be formed in a manner covering the outer peripheral area of the fragile substrate body 21 (which is one of the elements of the substrate body) by forming the plural penetration grooves 85 (having a greater width than that of the cutting region D and penetrating through the substrate main body 65) in the wiring substrate regions G and the cutting regions D, filling the penetration grooves 85 with the resin material 39, and cutting the substrate main body 65 into plural substrate bodies 21 by cutting the resin material 29 at the cutting regions D. Accordingly, the outer peripheral area of the substrate body 21 of the wiring substrate 81 can be prevented from being broken during handling (for example, the handling from completing the fabrication of the wiring substrate 81 to mounting the electronic components 12, 13 on the wiring substrate 81) of the wiring substrate 81.

Figure 41:
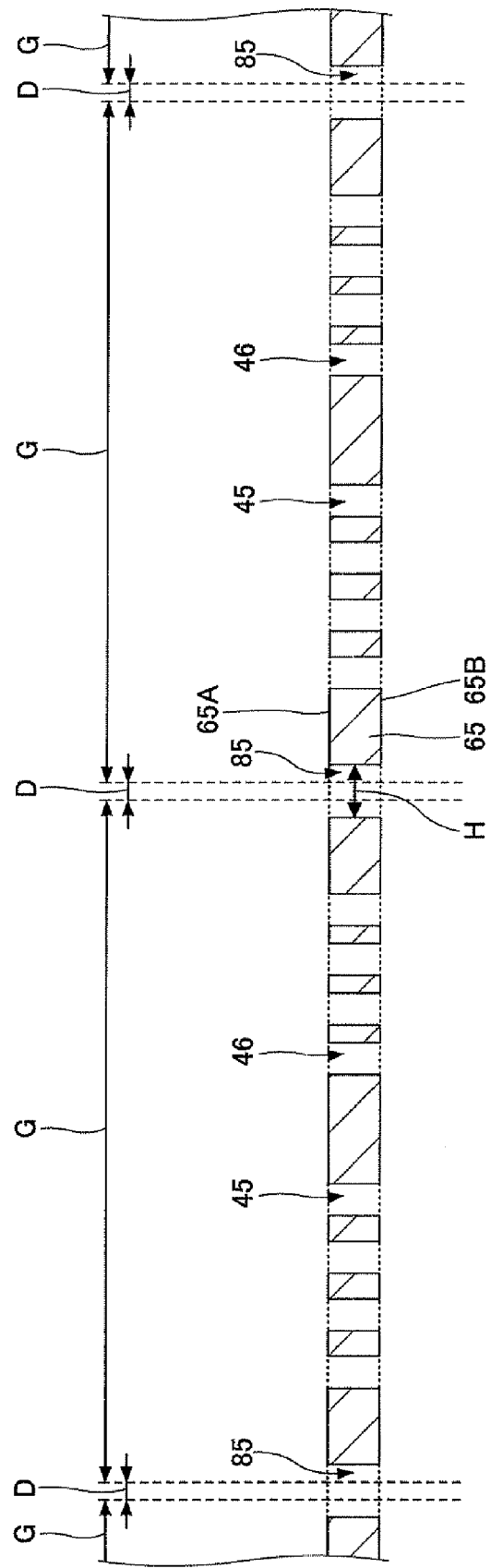
FIG. 41 is a schematic diagram illustrating a step of a another method of manufacturing a semiconductor device according to the second embodiment of the present invention (part 1)

Next, another method of manufacturing the semiconductor device 80 according to the second embodiment of the present invention is described with reference to FIGS. 41 and 42.

First, the substrate main body 65 described in FIG. 26 is prepared (preparation step). Then, in the step illustrated in FIG. 41, plural penetration grooves 85 are formed in the cutting region D and in the plural wiring substrate regions G adjacent to the dicing region D (penetration groove forming step). The penetration groove 85 has a width greater than the width of the cutting region D. The penetration groove 85 penetrates through the substrate main body 65 from the upper surface 65A of the substrate main body 65 to the lower surface 65S of the substrate main body 65. At the same time of forming the penetration grooves 85, plural through-holes 45, 46 are formed in the plural wiring substrate regions G. The plural through-holes 45, 46 penetrate through the substrate main body 65 from the upper surface 65A of the substrate main body 65 to the lower surface 65B of the substrate main body (through-hole forming step). In other words, the penetration grooves 85 and the through-holes 45, 46 are formed simultaneously.

By forming the penetration grooves 85 and the through-holes 45, 46 simultaneously, the number of steps for manufacturing the wiring substrate 81 can be reduced. Thereby, the manufacturing cost of the wiring substrate 81 can be reduced.

Figure 42:
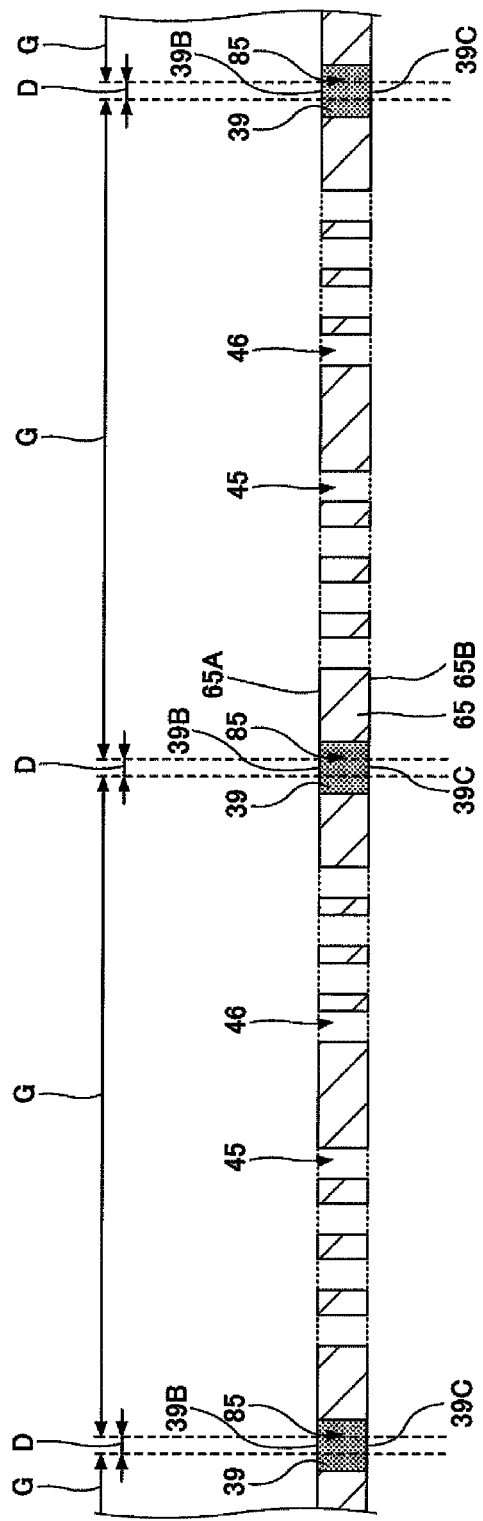
FIG. 42 is a schematic diagram illustrating a step of another method of manufacturing a semiconductor device according to the second embodiment of the present invention (part 2).

Then, in the step illustrated in FIG. 42, by performing the steps described above in FIGS. 7-9 of the first embodiment, the resin material 39 can be formed having its upper surface 39B substantially flush with the upper surface 65A of the substrate main body 65 at the penetration groove 85. In addition, the resin material 39 can be formed having its lower surface 39C substantially flush with the lower surface 65B of the substrate main body 65 at the penetration groove 85. Then, by performing the steps described above in FIGS. 30-39 of the second embodiment, plural semiconductor devices 80 of the second embodiment can be manufactured.

Therefore, with the above-described other method of manufacturing the wiring substrate 81 according to the second embodiment, the number of steps for manufacturing the wiring substrate 81 can be reduced by forming the penetration grooves 85 and the through-holes 45, 46 simultaneously. Thereby, the manufacturing cost of the wiring substrate 81 can be reduced.

Hence, with the above-described embodiments of the present invention, an outer peripheral area of a substrate body (including corner parts of the substrate body) of a wiring substrate can be prevented from being damaged.

Further, the present invention is not limited to these embodiments, but variations and modifications may be made without departing from the scope of the present invention.

The present application is based on Japanese Priority Application No. 2008-284147 filed on Nov. 5, 2008, with the Japanese Patent Office, the entire contents of which are hereby incorporated by reference.

What is claimed is:

1. A wiring substrate comprising:
a substrate body including a first surface, a second surface provided on an opposite side of the first surface, a first outer peripheral side surface that connects the first and second surfaces and is located at an outer peripheral part of the substrate body, and a through-hole penetrating the substrate body from the first surface to the second surface;
a first insulating film formed on the first surface of the substrate body and a side surface of the through-hole, the first insulating film including a first inner side surface contacting the first surface of the substrate body, an outer peripheral side surface located at an outer peripheral part of the first insulating film, and a front surface provided on an opposite side of the first inner surface;
a second insulating film formed on the second surface of the substrate body, the second insulating film including a second inner side surface contacting the second surface of the substrate body, and an outer peripheral side surface located at an outer peripheral part of the second insulating film, and a front surface provided on an opposite side of the second inner surface;
a penetration electrode formed in the through-hole, the penetration electrode including one end that is substantially flush with the front surface of the first insulating film, and another end that is substantially flush with the second surface of the substrate body;
a first wiring pattern electrically connected to the one end of the penetration electrode and provided on the front surface of the first insulating film, the first wiring pattern including a first pad to which an electronic component is connected;
a second wiring pattern electrically connected to the other end of the penetration electrode and provided on the front surface of the second insulating film, the second wiring pattern including a second pad to which another electronic component is connected;
a first insulating resin layer provided on the front surface of the first insulating film to cover the first wiring pattern, the first insulating resin layer including an opening part that exposes the first pad, and an outer peripheral side surface located at an outer peripheral part of the first insulating resin layer;
a second insulating resin layer provided on the front surface of the second insulating film to cover the second wiring pattern, the second insulating layer including an opening part that exposes the second pad, and an outer peripheral side surface located at an outer peripheral part of the second insulating resin layer;
a notch part provided at an outer peripheral part of the substrate body, the notch part being a recess defined by the first inner side surface of the first insulating film, the second inner side surface of the second insulating film, and the first outer peripheral side surface of the substrate body, the first outer peripheral side surface being located more inward than the outer peripheral side surface of the first insulating film, the outer peripheral side surface of the second insulating film, the outer peripheral side surface of the first insulating resin layer, and the outer peripheral side surface of the second insulating resin layer; and
a resin provided in the notch part and including an outer peripheral side surface that is substantially flush with the outer peripheral side surface of the first insulating film, the outer peripheral side surface of the second insulating film, the outer peripheral side surface of the first insulating resin layer, and the outer peripheral side surface of the second insulating resin layer;
wherein the notch part is a plurality of notch parts provided in the outer peripheral part of the substrate body,
wherein the plurality of notch parts are independent from each other.

2. The wiring substrate as claimed in claim 1, wherein the notch part has a frame-like shape.

3. The wiring substrate as claimed in claim 1, wherein the substrate body is a semiconductor substrate or a glass substrate.

4. The wiring substrate as claimed in claim 1, wherein the resin material includes epoxy resin, polyimide resin, or silicone resin.

5. The wiring substrate as claimed in claim 1, wherein the another electronic component is an external connection terminal.

6. The wiring substrate as claimed in claim 1, wherein the first and the second insulating resin layers are solder resist layers.

7. The wiring substrate as claimed in claim 1, wherein each of the first and the second insulating films is an oxide film.

8. A wiring substrate comprising:
a substrate body including a first surface, a second surface provided on an opposite side of the first surface, a first outer peripheral side surface that connects the first and second surfaces and is located at an outer peripheral part of the substrate body, and a through-hole penetrating the substrate body from the first surface to the second surface;
a first insulating film formed on the first surface of the substrate body and a side surface of the through-hole, the first insulating film including a first inner side surface contacting the first surface of the substrate body, an outer peripheral side surface located at an outer peripheral part of the first insulating film, and a front surface provided on an opposite side of the first inner surface;
a second insulating film formed on the second surface of the substrate body, the second insulating film including a second inner side surface contacting the second surface of the substrate body, and an outer peripheral side surface located at an outer peripheral part of the second insulating film, and a front surface provided on an opposite side of the second inner surface;
a penetration electrode formed in the through-hole, the penetration electrode including one end that is substantially flush with the front surface of the first insulating film, and another end that is substantially flush with the front surface of the second insulating film;
a first wiring pattern electrically connected to the one end of the penetration electrode and provided on the front surface of the first insulating film, the first wiring pattern including a first pad to which an electronic component is connected;
a second wiring pattern electrically connected to the other end of the penetration electrode and provided on the front surface of the second insulating film, the second wiring pattern including a second pad to which another electronic component is connected;
a first insulating resin layer provided on the front surface of the first insulating film to cover the first wiring pattern, the first insulating resin layer including an opening part that exposes the first pad, and an outer peripheral side surface located at an outer peripheral part of the first insulating resin layer;
a second insulating resin layer provided on the front surface of the second insulating film to cover the second wiring pattern, the second insulating layer including an opening part that exposes the second pad, and an outer peripheral side surface located at an outer peripheral part of the second insulating resin layer;
a notch part provided at an outer peripheral part of the substrate body, the notch part being a recess defined by the first inner side surface of the first insulating film, the second inner side surface of the second insulating film, and the first outer peripheral side surface of the substrate body, the first outer peripheral side surface being located more inward than the outer peripheral side surface of the first insulating film, the outer peripheral side surface of the second insulating film, the outer peripheral side surface of the first insulating resin layer, and the outer peripheral side surface of the second insulating resin layer; and
a resin provided in the notch part and including an outer peripheral side surface that is substantially flush with the outer peripheral side surface of the first insulating film, the outer peripheral side surface of the second insulating film, the outer peripheral side surface of the first insulating resin layer, and the outer peripheral side surface of the second insulating resin layer;
wherein the notch part is a plurality of notch parts provided in the outer peripheral part of the substrate body,
wherein the plurality of notch parts are independent from each other.

9. The wiring substrate as claimed in claim 8, wherein the notch part has a frame-like shape.

10. The wiring substrate as claimed in claim 8, wherein the substrate body is a semiconductor substrate or a glass substrate.

11. The wiring substrate as claimed in claim 8, wherein the resin material includes epoxy resin, polyimide resin, or silicone resin.

12. The wiring substrate as claimed in claim 8, wherein the another electronic component is an external connection terminal.

13. The wiring substrate as claimed in claim 8, wherein the first and the second insulating resin layers are solder resist layers.

14. The wiring substrate as claimed in claim 8, wherein each of the first and the second insulating films is an oxide film.

* * * * *